United States Patent
Chan et al.

(10) Patent No.: US 12,302,627 B2
(45) Date of Patent: *May 13, 2025

(54) SEMICONDUCTOR DEVICE WITH NON-CONFORMAL GATE DIELECTRIC LAYERS

(71) Applicant: Taiwan Semiconductor Manufacturing Company, Ltd., Hsinchu (TW)

(72) Inventors: Yung-Hsiang Chan, Taichung (TW); Wen-Hung Huang, Hsin-Chu (TW); Shan-Mei Liao, Hsinchu (TW); Jian-Hao Chen, Hsinchu (TW); Kuo-Feng Yu, Hsinchu County (TW); Kuei-Lun Lin, Keelung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/441,443

(22) Filed: Feb. 14, 2024

(65) Prior Publication Data

US 2024/0186188 A1 Jun. 6, 2024

Related U.S. Application Data

(63) Continuation of application No. 18/182,959, filed on Mar. 13, 2023, now Pat. No. 11,908,745, which is a
(Continued)

(51) Int. Cl.
*H01L 21/8234* (2006.01)
*H10D 30/67* (2025.01)
(Continued)

(52) U.S. Cl.
CPC ..... *H10D 84/0144* (2025.01); *H10D 30/6735* (2025.01); *H10D 30/6757* (2025.01);
(Continued)

(58) Field of Classification Search
CPC ....... H01L 21/28194; H01L 21/823412; H01L 21/823431; H01L 21/823437;
(Continued)

(56) References Cited

U.S. PATENT DOCUMENTS 8,796,666 B1 8/2014 Huang
8,822,243 B2 9/2014 Yan
(Continued)

*Primary Examiner* — Cheung Lee
(74) *Attorney, Agent, or Firm* — Haynes and Boone, LLP

(57) ABSTRACT

A semiconductor device includes a first semiconductor layer below a second semiconductor layer; first and second gate dielectric layers surrounding the first and the second semiconductor layers, respectively; and a gate electrode surrounding both the first and the second gate dielectric layers. The first gate dielectric layer has a first top section above the first semiconductor layer and a first bottom section below the first semiconductor layer. The second gate dielectric layer has a second top section above the second semiconductor layer and a second bottom section below the second semiconductor layer. The first top section has a first thickness. The second top section has a second thickness. The second thickness is greater than the first thickness.

20 Claims, 22 Drawing Sheets

Related U.S. Application Data continuation of application No. 17/233,098, filed on Apr. 16, 2021, now Pat. No. 11,605,563.

(51) Int. Cl.
*H10D 64/01* (2025.01)
*H10D 84/01* (2025.01)
*H10D 84/03* (2025.01)
*H10D 84/83* (2025.01)

(52) U.S. Cl.
CPC ....... *H10D 64/017* (2025.01); *H10D 84/0128* (2025.01); *H10D 84/0135* (2025.01); *H10D 84/0158* (2025.01); *H10D 84/038* (2025.01); *H10D 84/834* (2025.01); *H10D 84/0181* (2025.01)

(58) Field of Classification Search
CPC ....... H01L 21/82345; H01L 21/823462; H01L 21/823842; H01L 21/823857; H01L 27/088; H01L 27/0886; H01L 29/0673; H01L 29/165; H01L 29/42364; H01L 29/42392; H01L 29/66439; H01L 29/66545; H01L 29/775; H01L 29/7848; H01L 29/78696; H10D 30/6735; H10D 30/674; H10D 30/6757; H10D 84/0144; H10D 84/0158; H10D 84/0913
See application file for complete search history.

(56) References Cited

U.S. PATENT DOCUMENTS

| | | |
|---|---|---|
| 8,987,142 B2 | 3/2015 | Lee |
| 9,053,279 B2 | 6/2015 | Chang |
| 9,093,530 B2 | 7/2015 | Huang |
| 9,099,530 B2 | 8/2015 | Lin |
| 9,153,478 B2 | 10/2015 | Liu |
| 9,501,601 B2 | 11/2016 | Shih-Ming |
| 9,548,303 B2 | 1/2017 | Lee |
| 9,876,114 B2 | 1/2018 | Jangjian |
| 10,559,566 B1 | 2/2020 | Lee |

SEMICONDUCTOR DEVICE WITH NON-CONFORMAL GATE DIELECTRIC LAYERS

PRIORITY

This is a continuation application of U.S. patent application Ser. No. 18/182,959, filed Mar. 13, 2023, issuing as U.S. Pat. No. 11,908,745, which is a continuation application of U.S. patent application Ser. No. 17/233,098 filed Apr. 16, 2021, now U.S. Pat. No. 11,605,563, the entireties of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, gate-all-around (GAA) devices have been introduced in an effort to improve gate control by increasing gate-channel coupling, reduce OFF-state current, and reduce short-channel effects (SCEs). GAA devices include a plurality of channel layers stacked together to form the transistor channels which are engaged by a gate structure. The GAA devices are compatible with conventional complementary metal-oxide-semiconductor (CMOS) processes, allowing them to be aggressively scaled down while maintaining gate control and mitigating SCEs. However, due to the complex device structures and reduced spacing between features, it may be challenging to accomplish certain functions, such as to provide multiple threshold voltages, without incurring penalty to other performance characteristics. Therefore, although conventional technologies have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
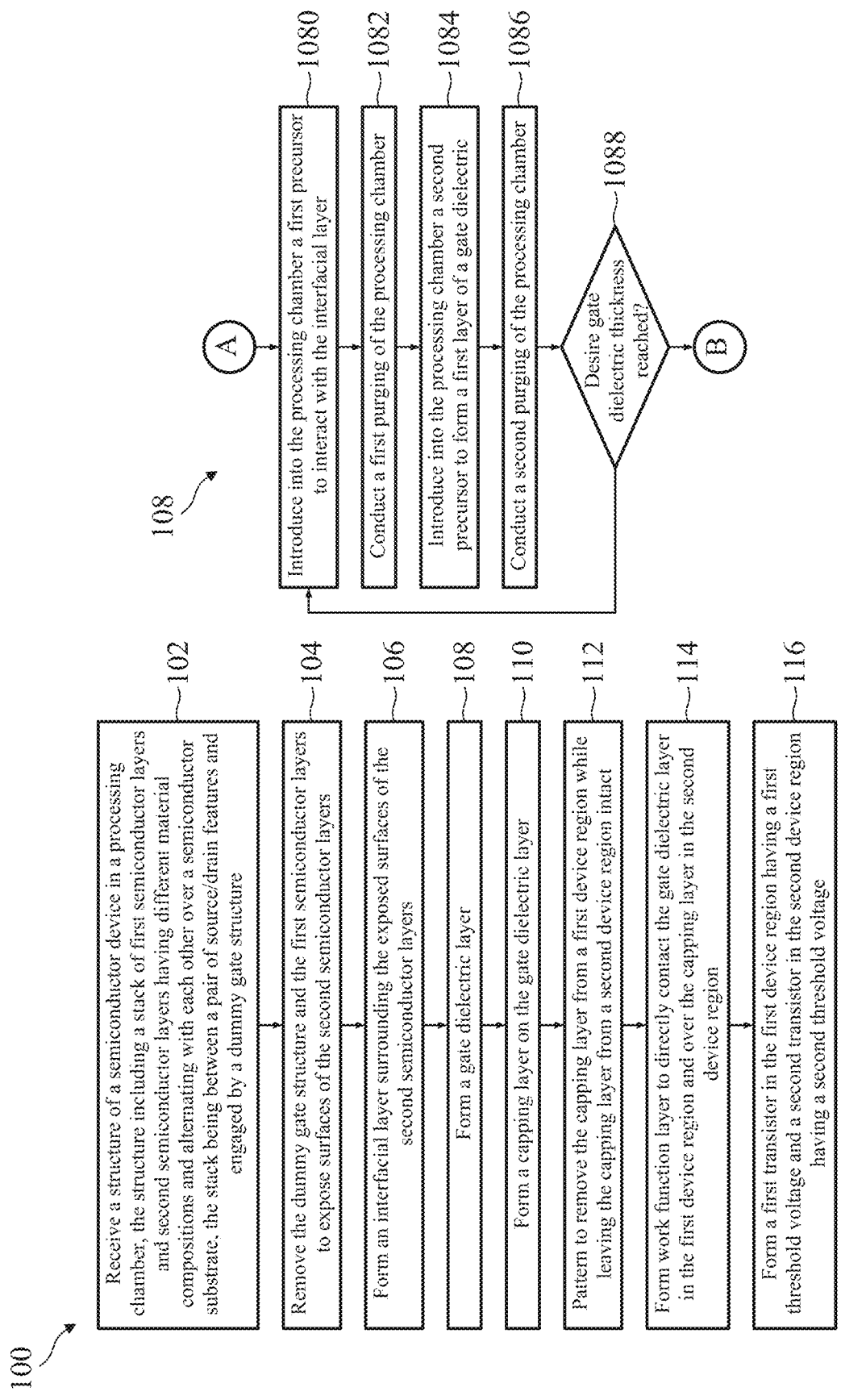
FIG. 1 is a flow chart of an example method for fabricating an embodiment of a device of the present disclosure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" may encompass the dimension range from 4.5 nm to 5.5 nm.

The present disclosure is generally related to ICs and semiconductor devices and methods of forming the same. More particularly, the present disclosure is related to gate-all-around (GAA) devices capable of providing multiple threshold voltages ($V_t$). A GAA device includes any device that has its gate structure, or portions thereof, formed around all-sides of a channel region (e.g. surrounding a portion of a channel region). In some instances, a GAA device may also be referred to as a quad-gate device where the channel region has four sides and the gate structure is formed on all four sides. The channel region of a GAA device may include one or more semiconductor layers, each of which may be in one of many different shapes, such as wire (or nanowire), sheet (or nanosheet), bar (or nano-bar), and/or other suitable shapes. In embodiments, the channel region of a GAA device may have multiple horizontal semiconductor layers (such as nanowires, nanosheets, or nano-bars) (hereinafter collectively referred to as "nanochannels") vertically spaced, making the GAA device a stacked horizontal GAA device. The GAA devices presented herein may be a complementary metal-oxide-semiconductor (CMOS) GAA device, a p-type metal-oxide-semiconductor (pMOS) GAA device, or an n-type metal-oxide-semiconductor (nMOS) GAA device. Further, the GAA devices may have one or more channel regions associated with a single, contiguous gate structure, or multiple gate structures. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure.

Multi-threshold voltage (or multi-$V_t$) devices have been implemented to optimize delays, reduce power consumption, and achieve other performance enhancements. Multi-$V_t$ devices may be formed by using dipole engineering and/or patterned work function metal (WFM) layers. Such engineering and/or patterning have been shown to sometimes damage gate dielectric layers. In the context of GAA devices where gate dielectric layers are of extremely small thicknesses, tolerance to such damages may be low. In other words, such damages may lead to unacceptable degradation to the reliability and/or performance of the device. Moreover, in some instances, the topmost channel layer beneath the gate dielectric layer may also be damaged, further degrading the device functionality. Accordingly, the present disclosure provides methods that mitigate such damages thereby improving device reliability and functionality.

Figure 2A:
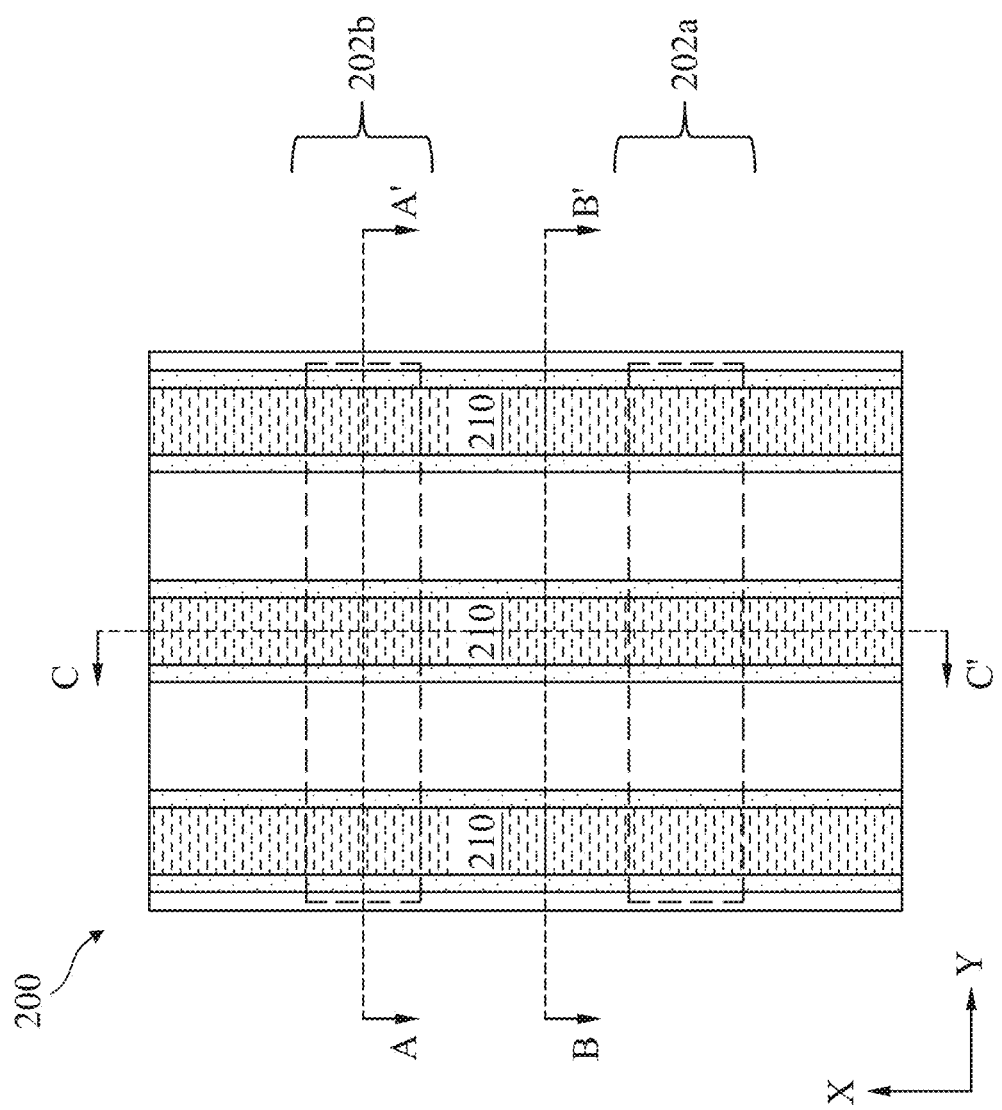
FIGS. 2A and 3A are top views of embodiments of devices of the present disclosure constructed at various fabrication stages according to some embodiments of the present disclosure.
Figure 2B:
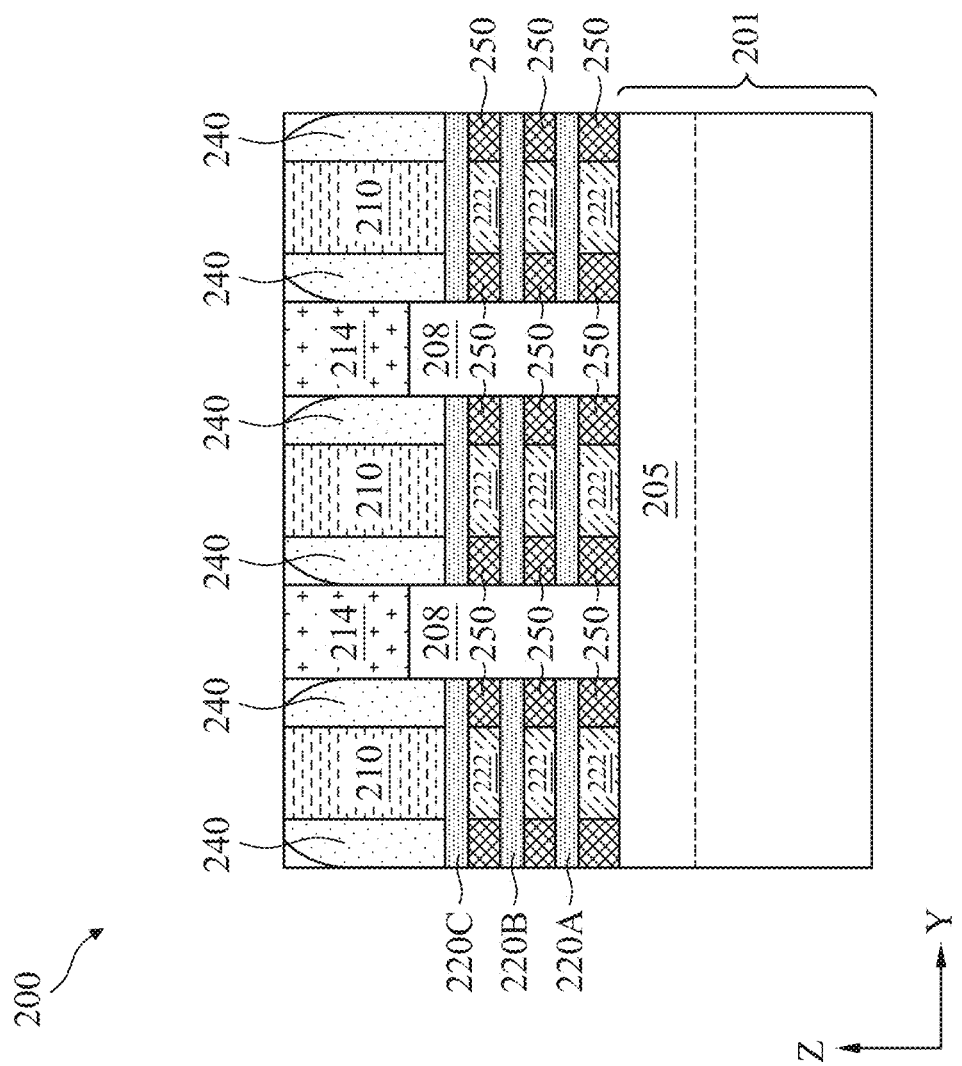
FIGS. 2B and 3B are cross sectional views of embodiments of devices of the present disclosure along the line A-A' in FIGS. 2A and 3A, respectively, according to some embodiments of the present disclosure.
Figure 2C:
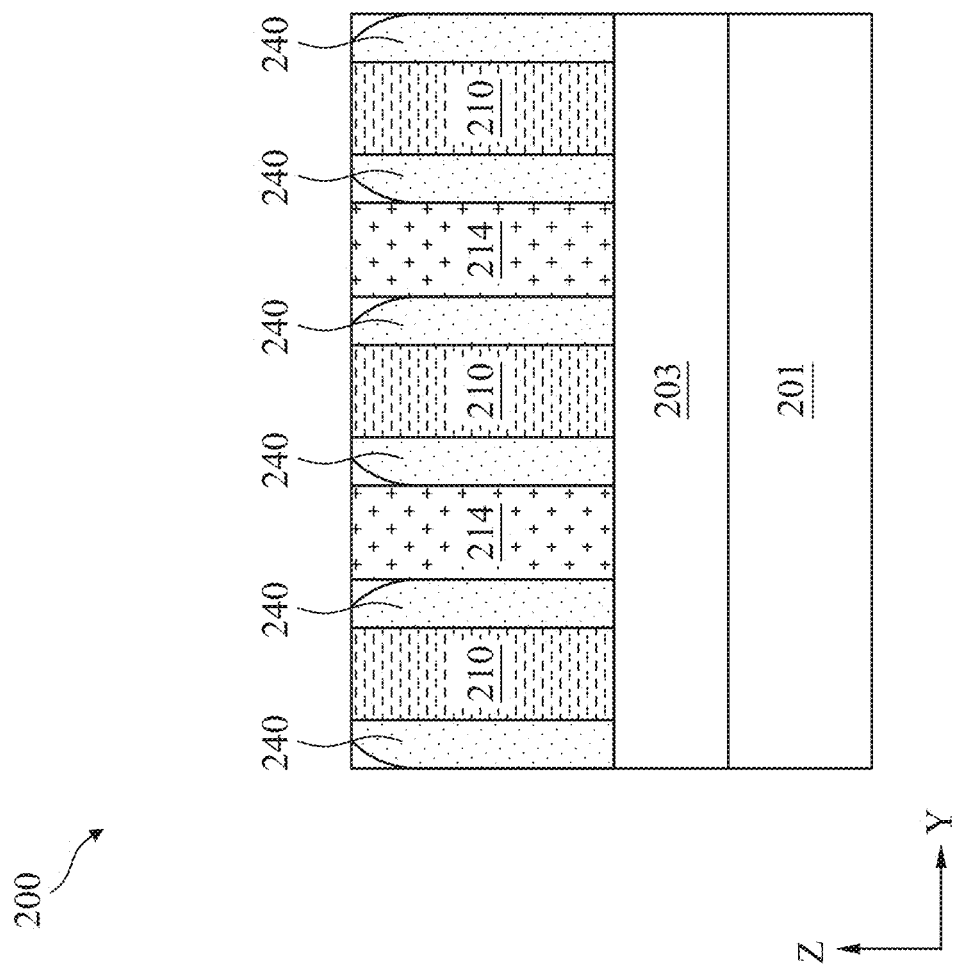
FIGS. 2C and 3C are cross sectional views of an embodiment of a device of the present disclosure along the line B-B' in FIGS. 2A and 3A, respectively, according to some embodiments of the present disclosure.
Figure 2D:
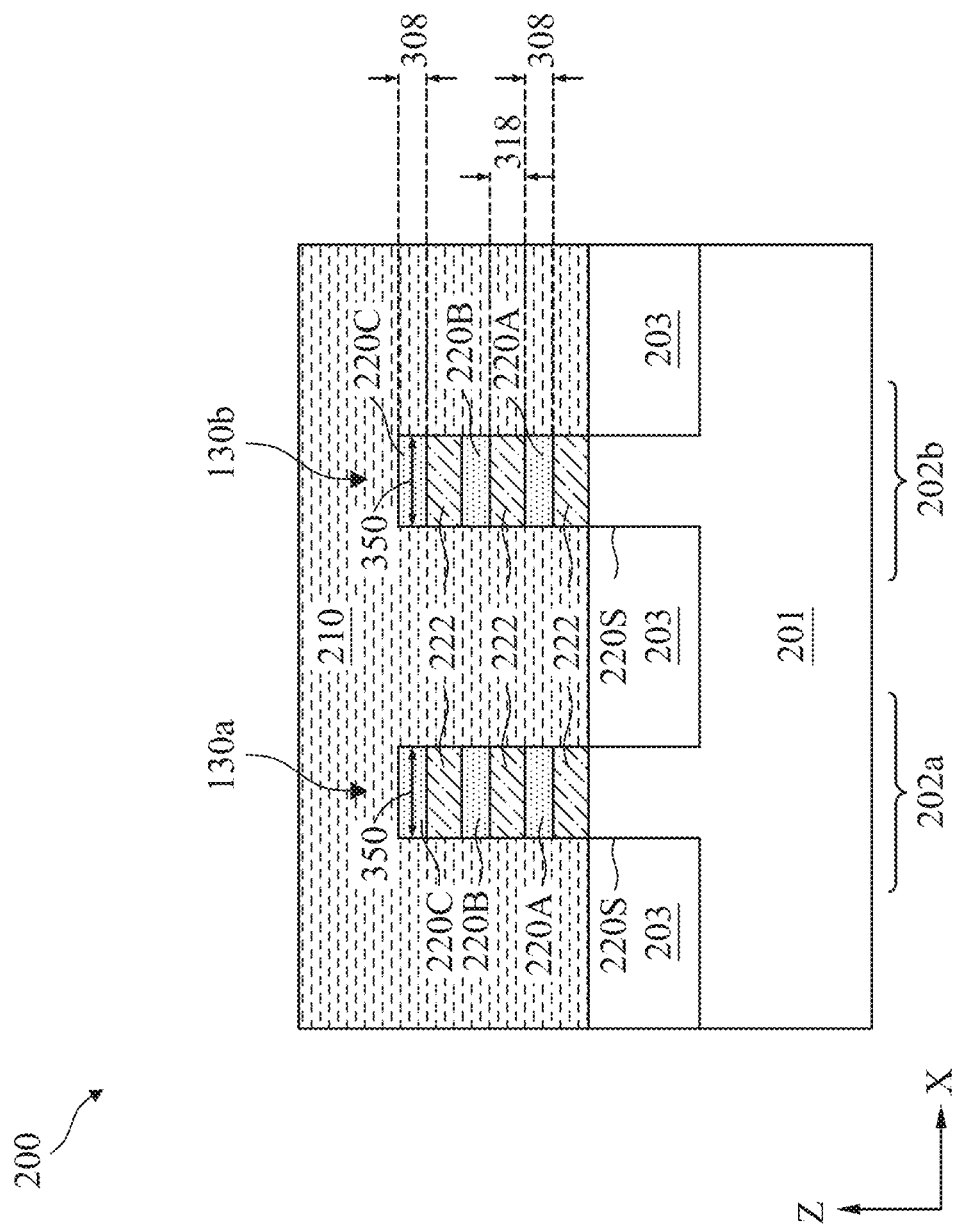
FIGS. 2D, 3D, 4, 5, 7, 8, 9, 10, 11, and 12 are cross sectional views of an embodiment of a device of the present disclosure along the line C-C' in FIGS. 2A and 3A, constructed at various fabrication stages according to some embodiments of the present disclosure.
Figure 3A:
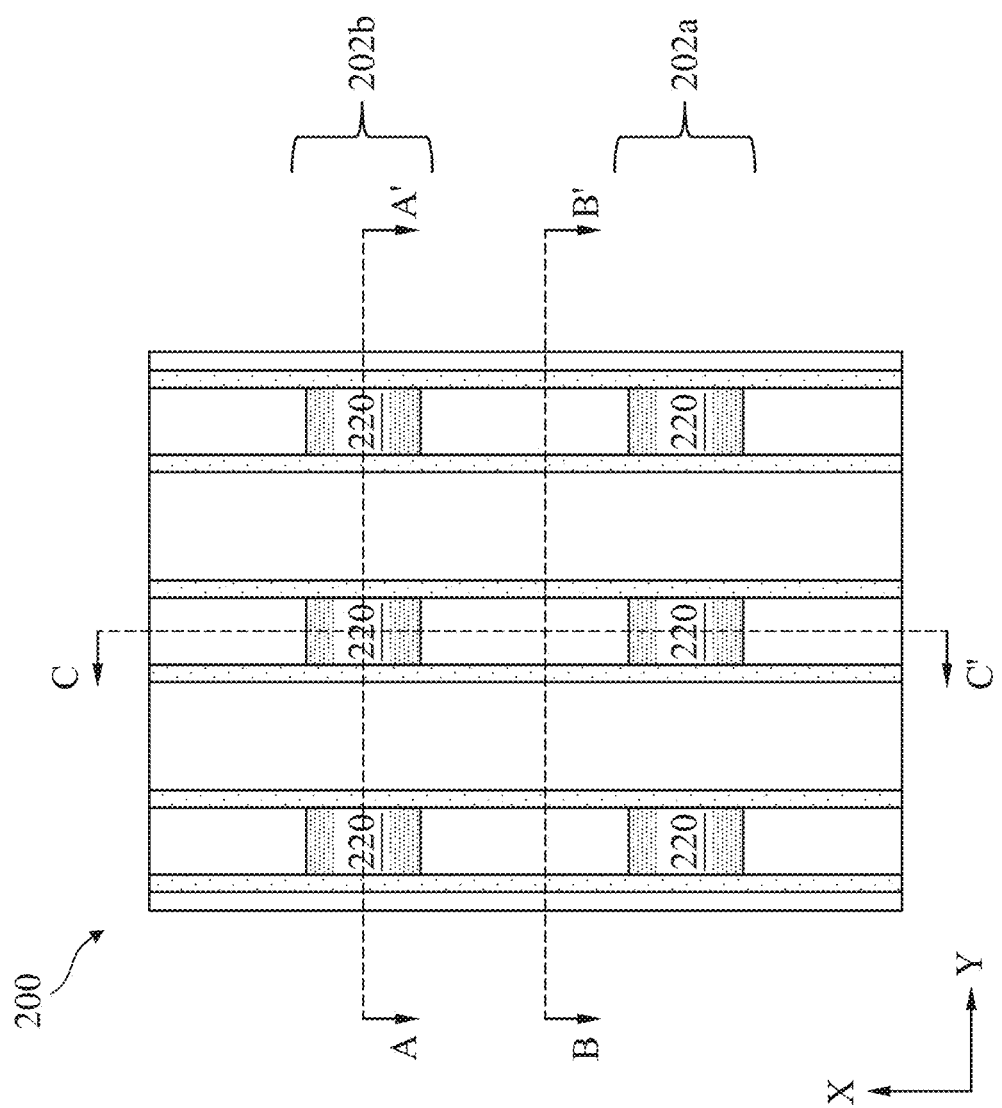
Figure 3B:
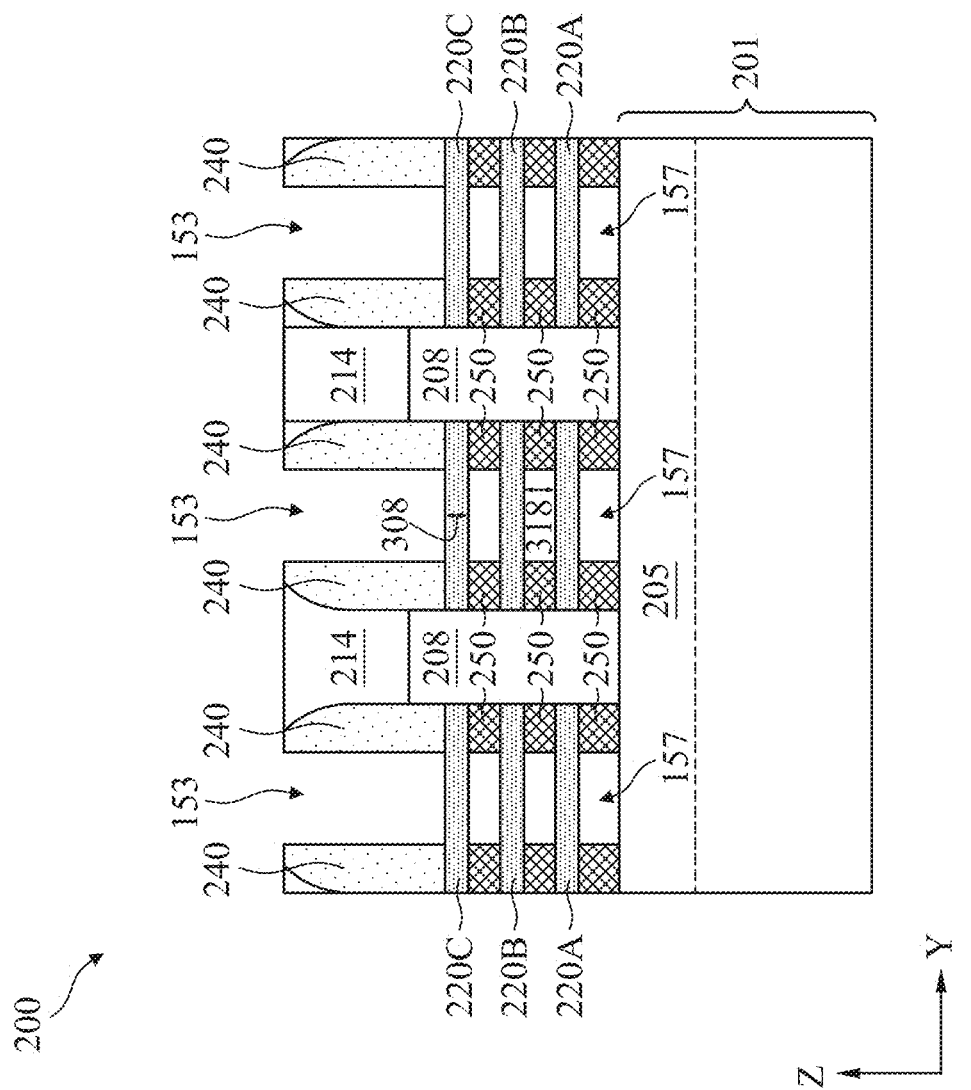
Figure 3C:
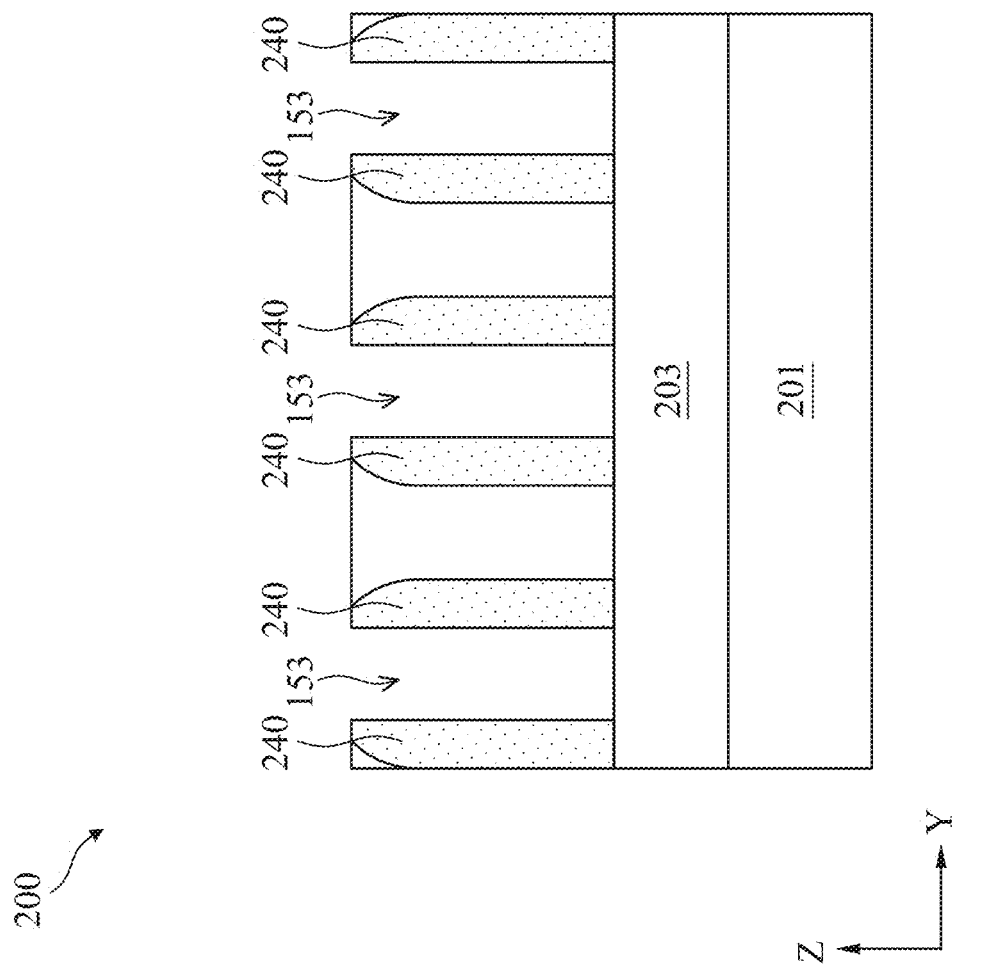
Figure 3D:
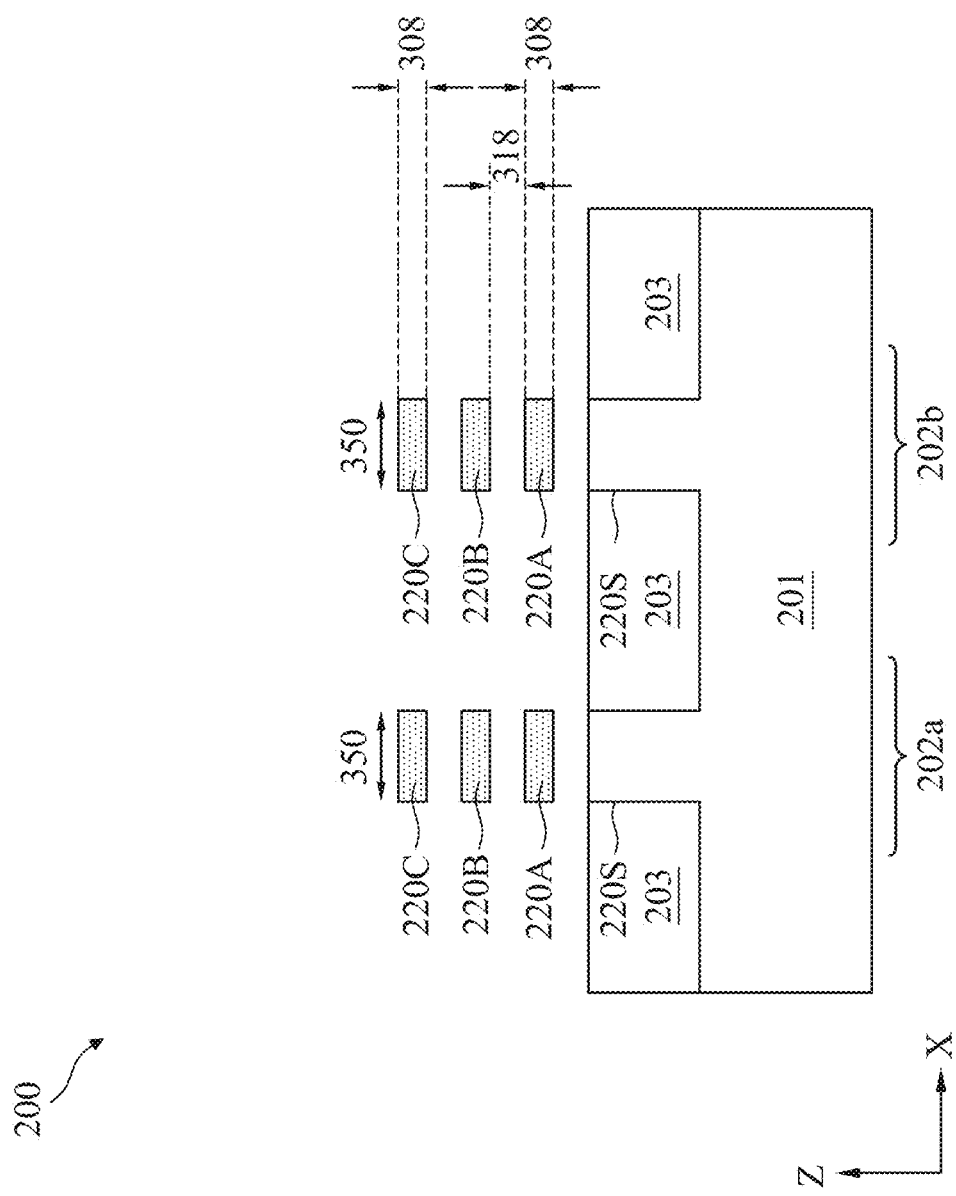

FIG. 1 is a flow chart of an example method for fabricating an embodiment of a GAA device of the present disclosure according to some embodiments of the present disclosure, where details for the block 108 is further illustrated. FIGS. 2A and 3A are top views of an embodiment of a GAA device of the present disclosure constructed at various fabrication stages according to some embodiments of the present disclosure. FIGS. 2B, 3B and 2C, 3C are cross sectional views of an embodiment of a GAA device of the present disclosure along the lines A-A' and B-B', of FIGS. 2A and 3A, respectively, according to some embodiments of the present disclosure. FIGS. 2D, 3D, and 4-12 are cross sectional views of an embodiment of a GAA device of the present disclosure along the line C-C' of FIGS. 2A and 3A at different fabrication stages, according to some embodiments of the present disclosure.

Referring to block 102 of FIG. 1 and FIGS. 2A-2D, the GAA device 200 (or simply referred to as the device 200) includes a substrate 201. In some embodiments, the substrate 201 contains a semiconductor material, such as bulk silicon (Si). Alternatively or additionally, another elementary semiconductor, such as germanium (Ge) in a crystalline structure, may also be included in the substrate 201. The substrate 201 may also include a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 201 may also include a semiconductor-on-insulator substrate, such as Si-on-insulator (SOI), SiGe-on-insulator (SGOI), Ge-on-insulator (GOI) substrates. Portions of the substrate 201 may be doped, such as the doped portions 205.

The doped portions 205 may be doped with p-type dopants, such as boron (B) or boron fluoride ($BF_3$), or doped with n-type dopants, such as phosphorus (P) or arsenic (As). The doped portions 205 may also be doped with combinations of p-type and n-type dopants. The doped portions 205 may be formed directly on the substrate 201, in a p-well structure, in an n-well structure, in a dual-well structure, or using a raised structure.

A stack of semiconductor layers 220 and 222 are formed over the substrate 201 in an interleaving or alternating fashion, extending vertically (e.g. along the Z-direction) from the substrate 201. For example, a semiconductor layer 222 is disposed over the substrate 201, a semiconductor layer 220 is disposed over the semiconductor layer 222, and another semiconductor layer 222 is disposed over the semiconductor layer 220, so on and so forth. In the depicted embodiments, there are three layers of semiconductor layers 220 and three layers of semiconductor layers 222 alternating between each other. However, there may be any appropriate number of layers in the stack. For example, there may be two (2) to ten (10) layers of semiconductor layers 220, alternating with two (2) to ten (10) layers of semiconductor layers 222 in the stack. The material compositions of the semiconductor layers 220 and 222 are configured such that they have an etching selectivity in a subsequent etching process. For example, in some embodiments, the semiconductor layers 220 contain silicon germanium (SiGe), while the semiconductor layers 222 contain silicon (Si). In some other embodiments, the semiconductor layers 222 contain SiGe, while the semiconductor layers 220 contain Si. In the depicted embodiment, the semiconductor layers 220 each has a substantially uniform thickness, referred to as the thickness 308, while the semiconductor layers 222 each has a substantially uniform thickness, referred to as the thickness 318. The thicknesses 308 and 318 may be chosen based on fabrication and/or device performance considerations for device 200. For example, thickness 318 may be configured to define a desired distance (or gap) between adjacent channels of device 200 (e.g., between semiconductor layers 220); thickness 308 may be configured to achieve desired thickness of channels of device 200. Both thickness 308 and thickness 318 may be configured to achieve desired performance of device 200. In some embodiments, thickness 308 and thickness 318 are about 1 nm to about 10 nm. If the thickness 308 and thickness 318 are too small, such as less than about 1 nm, there may be insufficient dimension to form device features therein, or the formed device feature may be too narrow to have proper functionality. If the thickness 308 and thickness 318 are too large, such as greater than about 10 nm, the device features may unnecessarily occupy valuable chip spaces without substantial improvements to device performances.

The stack of semiconductor layers 220 and 222 are patterned into a plurality of fin structures, for example, into fin structures (or fins) 130a and 130b. Each of the fins 130a and 130b includes a stack of the semiconductor layers 220 and 222 disposed in an alternating manner with respect to one another. The fins 130a and 130b each extends lengthwise horizontally in a Y-direction and are separated from each other horizontally in an X-direction. The fins may each have a lateral width along the X-direction, referred to as the width 350. It is understood that the X-direction and the Y-direction are horizontal directions that are perpendicular to each other, and that the Z-direction is a vertical direction that is orthogonal (or normal) to a horizontal XY plane defined by the X-direction and the Y-direction. The semiconductor substrate may have its top surface aligned in parallel to the XY plane.

The fins 130a and 130b may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The regions in which the fins are formed will be used to form active devices through subsequent processing, and are thus referred to as active regions. For example, fin 130a is formed in the active region 202a, and the fin 130b is formed in the active region 202b. Both fins 130a and 130b are formed over the doped portions 205. In some embodiments, as described later, the active regions 202a and 202b are configured to form transistors with different threshold voltages ($V_t$). In some embodiments, the active regions 202a and 202b are configured to form transistors of different types, such as n-type transistors and p-type transistors. In some embodiments, the fins 130a and 130b may each have a lateral width 350 along the X-direction. The width 350 may be about 5 nm to about 100 nm, such as 6 nm to about 20 nm.

The device 200 includes isolation features 203, which may be shallow trench isolation (STI) features. In some examples, the formation of the isolation features 203 includes etching trenches into the substrate 201 between the active regions and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 203. The isolation features 203 may have a multi-layer structure such as a thermal oxide liner layer over the substrate 201 and a filling layer (e.g., silicon nitride or silicon oxide) over the thermal oxide liner layer. Alternatively, the isolation features 203 may be formed using any other traditional isolation technologies. As illustrated in FIG. 2D, the fins 130a and 130b are located above the top surface of the isolation features 203 and the top surface of the doped portions 205.

The device 200 further includes dummy gate structures 210. The dummy gate structures 210 are formed over a portion of each of the fins 130a and 130b, and over the isolation features 203 in between the fins 130a and 130b. The dummy gate structures 210 may be configured to extend lengthwise in parallel to each other, for example, each along the X-direction. In some embodiments, the dummy gate structures each wraps around the top surface and side surfaces of each of the fins. The dummy gate structures 210 may include polysilicon. In some embodiments, the dummy gate structures 210 also include one or more mask layers, which are used to pattern the dummy gate electrode layers. As described later, the dummy gate structures 210 may undergo a gate replacement process through subsequent processing to form metal gates, such as a high-k metal gate, as discussed in greater detail below. The dummy gate structures 210 may be formed by a procedure including deposition, lithography patterning, and etching processes. The deposition processes may include CVD, ALD, PVD, other suitable methods, and/or combinations thereof.

Moreover, the device 200 includes gate spacers 240 on the sidewalls of the dummy gate structures 210. The gate spacers 240 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 240 may include a single layer or a multi-layer structure. In some embodiments, the gate spacers 240 may have thicknesses in the range of a few nanometers (nm). In some embodiments, the gate spacers 240 may be formed by depositing a spacer layer (containing the dielectric material) over the dummy gate structures 210, followed by an anisotropic etching process to remove portions of the spacer layer from the top surfaces of the dummy gate structures 210. After the etching process, portions of the spacer layer on the sidewall surfaces of the dummy gate structures 210 substantially remain and become the gate spacers 240. In some embodiments, the anisotropic etching process is a dry (e.g. plasma) etching process. Additionally or alternatively, the formation of the gate spacers 240 may also involve chemical oxidation, thermal oxidation, ALD, CVD, and/or other suitable methods. In the active regions, the gate spacers 240 are formed over the top layer of the semiconductor layers 220 and 222. Accordingly, the gate spacers 240 may also be interchangeably referred to as the top spacers 240. In some examples, one or more material layers (not shown) may also be formed between the dummy gate structures 210 and the corresponding top spacers. The one or more material layers may include an interfacial layer and/or a high-k dielectric layer.

The device further includes inner spacers 250 between end portions of vertically adjacent semiconductor layers 220. The inner spacers 250 may include a dielectric material, for example, a dielectric material selected from $SiO_2$, SION, SiOC, SiOCN, or combinations thereof. In some embodiments, portions of the fins 130a, 130b not covered by the dummy gate structures 210 or the gate spacers 240 are recessed to form source/drain trenches. The semiconductor layers 222 are laterally recessed to form gaps between end portions of the vertically adjacent semiconductor layers 220. The dielectric material may then be deposited into the gaps, and etched back to remove any excess materials in the source/drain trenches, thereby forming the inner spacers 250.

The device 200 further includes epitaxial source/drain features 208 formed in the source/drain trenches and on both ends of the semiconductor layers 220. In some embodiments, a source/drain feature is a source electrode, and the other source/drain feature is a drain electrode. Each of the semiconductor layers 220 connects two epitaxial source/drain features 208. A portion of the semiconductor layers 220 may constitute a portion of a transistor channel. Multiple processes including etching and growth processes may be employed to grow the epitaxial source/drain features 208. In the depicted embodiment, the epitaxial source/drain features 208 have top surfaces that extend higher than the top surface of the topmost semiconductor layer 220. However, in other embodiments, the epitaxial source/drain features 208 may alternatively have top surfaces that are about even with the top surface of the topmost semiconductor layer 220.

In some embodiments, the epitaxial source/drain features 208 may merge together, for example, along the X-direction, to provide a larger lateral width than an individual epitaxial feature. In the depicted embodiments, the epitaxial source/drain features 208 are not merged. The epitaxial source/drain features 208 may include any suitable semiconductor materials. In the depicted embodiments, the epitaxial source/drain features 208 is an n-type GAA device, and therefore may include Si, SiC, or combinations thereof. In some embodiments, the epitaxial source/drain features 208 in a p-type GAA device may include Si, SiGe, Ge, SiGeC, or combinations thereof. The source/drain features 208 may be doped in-situ or ex-situ. For example, the epitaxially grown Si source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features; and the epitaxially grown SiGe source/drain features may be doped with boron. One or more annealing processes may be performed to activate the dopants in the epitaxial source/drain features 208. The annealing processes may comprise rapid thermal annealing (RTA) and/or laser annealing processes.

The device 200 also includes an interlayer dielectric (ILD) layer 214 formed over the epitaxial source/drain features 208. The ILD layer 214 may also be formed in between the adjacent gates 210 along the Y-direction, and in between the source/drain features 208 along the X-direction. The ILD layer 214 may include a dielectric material, such as a high-k material, a low-k material, or an extreme low-k material. For example, the ILD layer 214 may include $SiO_2$, SiOC, SiON, or combinations thereof. The ILD layer 214 may include a single layer or multiple layers, and may be formed by a suitable technique, such as CVD, ALD, and/or spin-on techniques. After forming the ILD layer 214, a CMP process may be performed to remove excessive ILD layer 214 and planarize the top surface of the ILD layer 214. Among other functions, the ILD layer 214 provides electrical isolation between the various components of the device 200.

Referring to block 104 of FIG. 1 and FIGS. 3A-3D, the dummy gate structures 210 are selectively removed through any suitable lithography and etching processes, thereby forming the gate trenches 153. In some embodiments, the lithography process may include forming a photoresist layer (resist), exposing the resist to a pattern, performing a post-exposure bake process, and developing the resist to form a masking element, which exposes a region including the dummy gate structures 210. Then, the dummy gate structures 210 are selectively etched through the masking element. In some other embodiments, the top spacers 240 may be used as the masking element or a part thereof. For example, the dummy gate structures 210 may include polysilicon, the top spacers 240 and the inner spacers 250 may include dielectric materials, and the semiconductor layers 220 includes a semiconductor material. Therefore, an etch selectivity may be achieved by selecting appropriate etching chemicals, such that the dummy gate structures 210 may be removed without substantially affecting the other components of the device 100. Subsequently, the remaining portions of the semiconductor layers 222 are selectively removed without substantially affecting the semiconductor layers 220. As a result, openings 157 are formed between the vertically adjacent semiconductor layers 220. The openings 157 and the gate trenches 153 collectively expose each of the semiconductor layers 220 circumferentially around the Y-direction. In addition, the portion of the doped regions 205 beneath the semiconductor layers 220 are also exposed in the openings 157. Because the etching operations do not substantially affect the semiconductor layers 220, the semiconductor layers 220 maintain the thickness 308, and the openings 157 may have a height corresponding to the thickness 318 (or interchangeably referred to as the height 318).

Figure 4:
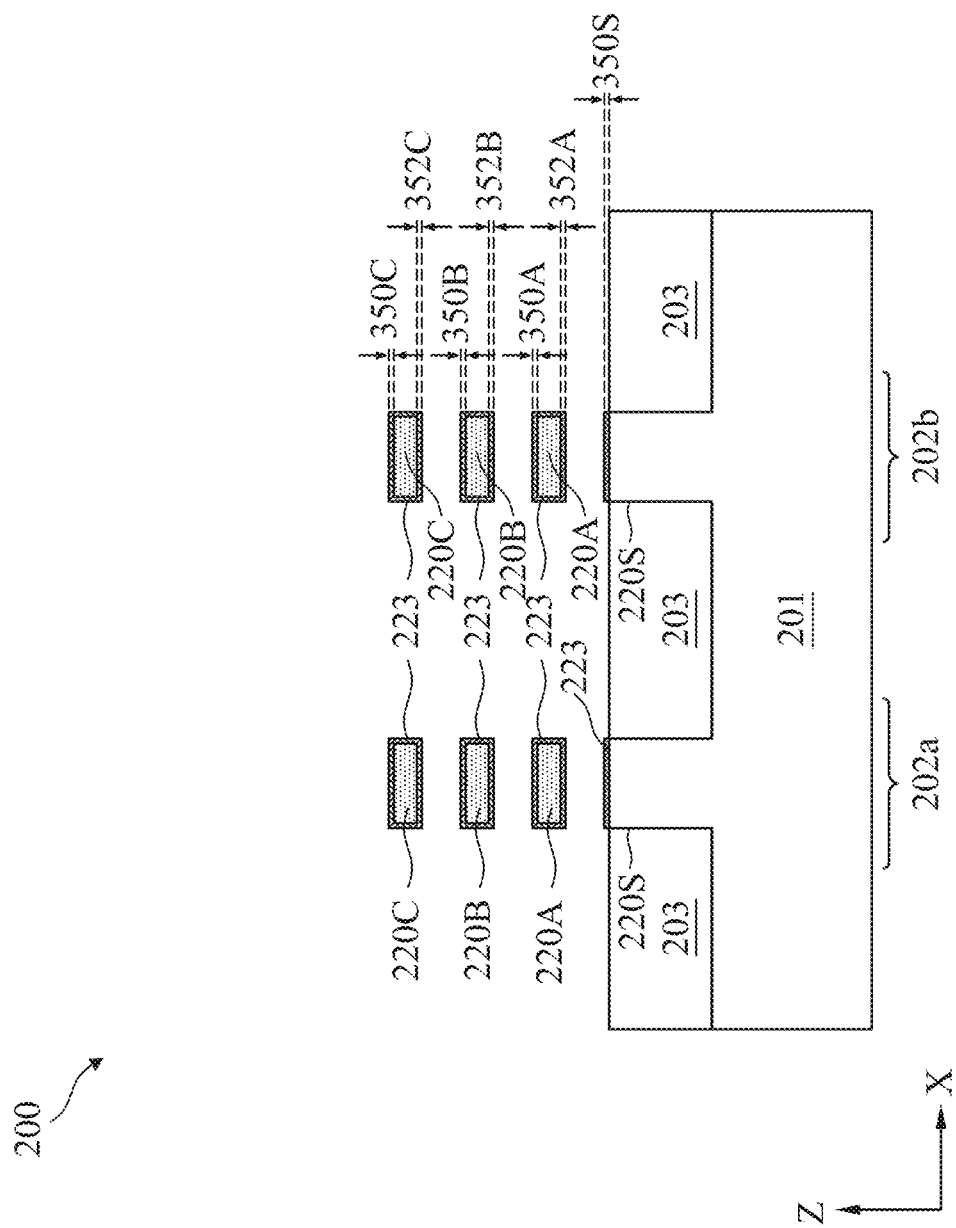

FIGS. 4-11 illustrate an example method for forming a gate structure in place of the dummy gate structures 210. Referring to block 106 of FIG. 1 and to FIG. 4, a dielectric layer 223 is formed over the surfaces of semiconductor layers 220 exposed in the openings 157 and the gate trenches 153, as well as the substrate 201 exposed in the opening 157. This dielectric layer 223 may be an interfacial layer. In some embodiments, the dielectric layer 223 includes an oxide, such as a silicon dioxide. Any suitable methods may be used to form the dielectric layer 223, such as ALD, CVD, or other deposition methods. Alternatively, in the depicted embodiments, the dielectric layer 223 may also be formed by an oxidation process, such as thermal oxidation or chemical oxidation. In many embodiments, the interfacial layer 223 improves the adhesion between the semiconductor substrate and the subsequently formed gate dielectric layers. In some embodiments, the dielectric layer 223 has a substantially uniform thickness around each semiconductor layers 220 and over the semiconductor substrate 201. In the depicted embodiments, the bottommost semiconductor layer 220 (e.g., the semiconductor layer closest to the semiconductor substrate 201) is also referred to as the semiconductor layers 220A; the semiconductor layer 220 immediately above the semiconductor layer 220A is referred to as the semiconductor layer 220B; and the topmost semiconductor layer 220 is referred to as the semiconductor layer 220C. As illustrated in FIG. 4, the portion of the dielectric layer 223 on the top surface of the semiconductor layer 220A has an average thickness 350A; the portion of the dielectric layer 223 on the bottom surface of the semiconductor layer 220A has an average thickness 352A. The average thickness 350A is substantially similar to the average thickness 352A. Similarly, the portion of dielectric layer 223 on the top surface of the semiconductor layer 220B has an average thickness 350B; the portion of the dielectric layer 223 on the bottom surface of the semiconductor layer 220B has an average thickness 352B. The average thickness 350B is substantially similar to the average thickness 352B. Moreover, the portion of dielectric layer 223 on the top surface of the semiconductor layer 220C has an average thickness 350C; the portion of the dielectric layer 223 on the bottom surface of the semiconductor layer 220C has an average thickness 352C. The average thickness 350C is substantially similar to the average thickness 352C. Furthermore, the dielectric layer 223 over the substrate 201 has an average thickness 350S. In some embodiments, the average thickness 350A, 350B, 350C, and 350S are substantially similar to each other. Accordingly, the thicknesses 352A, 352B, and 352C are also substantially similar to each other.

Figure 5:
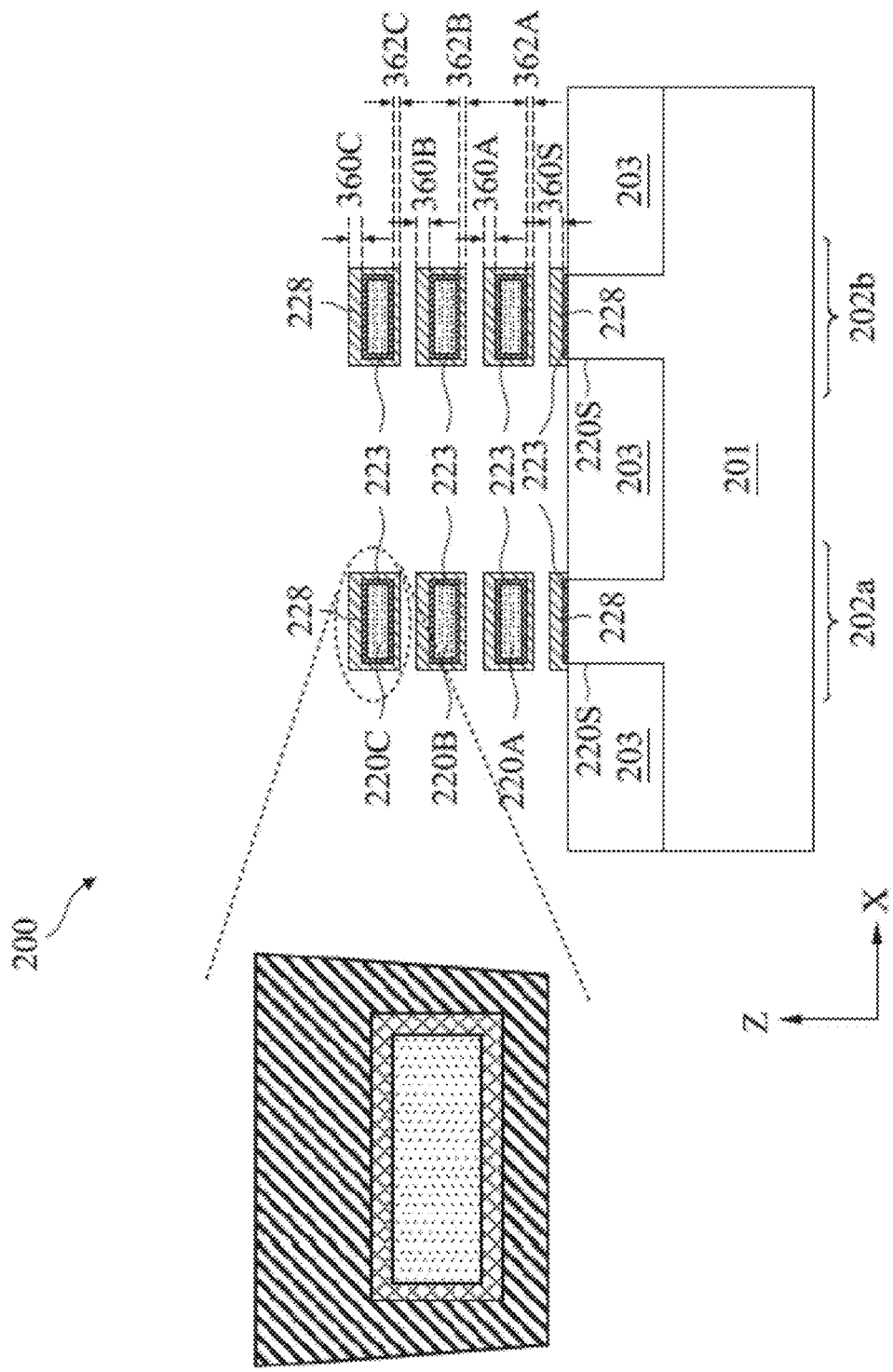

Referring to block 108 of FIG. 1 and to FIG. 5, gate dielectric layer 228 is formed around the dielectric layers 223. The gate dielectric layers 228 at least partially fill the trenches 153 and the openings 157. In some embodiments, the gate dielectric layers 228 may be formed around the dielectric layers 223 over each of the semiconductor layers 220, such that they wrap around the semiconductor layers 220 in 360 degrees. Additionally, the gate dielectric layers 228 also directly contact vertical sidewalls of the inner spacers 250 and of the top spacers 240. In some embodiments, the gate dielectric layer 228 may be a high-k dielectric layer. For example, the gate dielectric layers 228 may contain a dielectric material having a dielectric constant greater than a dielectric constant of $SiO_2$, which is approximately 3.9. For example, the gate dielectric layers 228 may include hafnium oxide ($HfO_2$), which has a dielectric constant in a range from about 18 to about 40. As various other examples, the gate dielectric layers 228 may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. As described in more detail below, the formation of the gate dielectric layers 228 may be by any suitable processes, such as CVD, PVD, ALD, or combinations thereof.

In some other approaches not implementing methods of the present disclosure, the gate dielectric layers 228 may be formed conformally on the device 100. In other words, portions of the dielectric layers 228 on a top surface of a semiconductor layer 220 may have the same thickness as the portions of the dielectric layers 228 on a bottom surface of the semiconductor layer 220. Additionally, portions of the dielectric layers 228 surrounding a topmost semiconductor layer 220 may have the same thickness as the portions of the dielectric layer 228 surrounding the bottommost semiconductor layer 220. In such approaches, due to the narrow spacing between adjacent semiconductor layers, all portions of the gate dielectric layer 228 may be similarly thin. Such thin gate dielectric layers 228, particularly the portions on top surfaces of higher semiconductor layers 220, may be particularly prone to damages in dry and wet etching operations. For example, as described in detail later, in subsequent patterning operations to form transistors of different types and/or transistors having different threshold voltages, the dry etching, the wet etching, or combinations thereof may cause losses to the gate dielectric layers 228. Accordingly, some of those originally thin portions of the gate dielectric layer 228 on top surfaces of the higher semiconductor layers 220 may sustain damages unacceptable to maintain satisfactory device performances. Accordingly, in embodiments of the present disclosure, asymmetric (or non-conformal) dielectric layers 228 are provided, such that the portions on top surfaces of higher semiconductor layers 220 have greater thicknesses, which better sustains any potential damages; while portions on bottom surfaces of lower semiconductor layers 220 have smaller thicknesses which allows for further scaling down of the device. As illustrated in FIG. 5, the gate dielectric layer 228 is not conformal. In some embodiments, the design of the gate dielectric layer may be dependent upon the type of applications for the device 200. For example, in some embodiments, the device 200 may be a standard device; while in some other embodiments, the device 200 may be an ultra-low threshold voltage device. Different types of devices may require different gate dielectric layer thicknesses.

In some embodiments, the device 200 is an ultra-low threshold voltage device. The portion of gate dielectric layer 228 on the dielectric layer 223 (over the top surface of the semiconductor layer 220B) has an average thickness 360B; the portion of the gate dielectric layer 228 on the dielectric layer 223 (over the bottom surface of the semiconductor layer 220B) has an average thickness 362B. The average thickness 360B is greater than the average thickness 362B. In some embodiments, a ratio of the average thickness 360B to the average thickness 362B may be about 1:0.95 to about 1:0.99, for example, about 1:0.96 to about 1:0.98. In some embodiments, a difference between the average thickness 360B and the average thickness 362B may be about 0.1 Å to about 0.7 Å, such as about 0.3 Å to about 0.5 Å. Moreover, the portion of gate dielectric layer 228 on the dielectric layer 223 (over the top surface of the semiconductor layer 220C) has an average thickness 360C; the portion of the gate dielectric layer 228 on the dielectric layer 223 (over the bottom surface of the semiconductor layer 220C) has an average thickness 362C. The average thickness 360C is greater than the average thickness 362C. In some embodiments, a ratio of the average thickness 360C to the average thickness 362C may be about 1:0.96 to about 1:0.99, for example, about 1:0.97 to about 1:0.98. In some embodiments, a difference between the average thickness 360C and the average thickness 362C may be about 0.2 Å to about 0.8 Å, such as about 0.4 Å to about 0.6 Å. If the difference is too small, the benefit associated with the asymmetric design (e.g., mitigate the effect of etching on the integrity of the gate dielectric layer 228) may be lost or partially lost; if the difference is too large, the benefit of the extra thickness (e.g. on top of the semiconductor layers 220) may not justify their chip footprint.

The portion of gate dielectric layer 228 on the dielectric layer 223 over the top surface of the semiconductor substrate 201 has an average thickness 360S. In some embodiments, the average thickness 360A is less than the average thickness 360B; and the average thickness 360B is less than the average thickness 360C. For example, a difference $\Delta(B-A)$ between the 360B and the average thickness 360A is about 0.2 Å to about 0.8 Å, such as about 0.4 Å to about 0.6 Å. Moreover, a difference $\Delta(C-B)$ between the 360C and the average thickness 360B is about 0.2 Å to about 0.8 Å, such as about 0.4 Å to about 0.6 Å. In some embodiments, the average thickness 362B is less than the average thickness 362C. For example, a difference $\Delta'(C-B)$ between the 362C and the average thickness 362B is about 0.2 Å to about 0.8 Å, such as about 0.4 Å to about 0.6 Å. If the difference is too small, the benefit associated with the asymmetric design (e.g., mitigate the effect of etching on the integrity of the gate dielectric layer 228) may be lost or partially lost; if the difference is too large, the benefit of the extra thickness (e.g., around higher semiconductor layers 220) may not justify their chip footprint.

In some embodiments, the device 200 is a standard nanosheet device. A ratio of the average thickness of the portion of the gate dielectric layer 228 above a semiconductor layer 220 to the average thickness of the portion below the semiconductor layer 220 may be about 0.80 to about 0.99. For example, the portion of the gate dielectric layer 228 on the top surface of the dielectric layer 223 (over the semiconductor layer 220A) has an average thickness 360A; the portion of the gate dielectric layer 228 on the bottom surface of the dielectric layer 223 (below the semiconductor layer 220A) has an average thickness 362A. The average thickness 360A is greater than the average thickness 362A. In some embodiments, a ratio of the average thickness 360A to the average thickness 362A may be about 1:0.96 to about 1:0.99, for example, about 1:0.97 to about 1:0.99. In some embodiments, a difference between the average thickness 360A and the average thickness 362A may be about 0.1 Å to about 0.5 Å, for example, about 0.2 Å to about 0.4 Å. Similarly, the portion of gate dielectric layer 228 on the dielectric layer 223 (over the top surface of the semiconductor layer 220C) has an average thickness 360C; the portion of the gate dielectric layer 228 on the dielectric layer 223 (over the bottom surface of the semiconductor layer 220C) has an average thickness 362C. The average thickness 360C is greater than the average thickness 362C. In some embodiments, a ratio of the average thickness 360C to the average thickness 362C may be about 1:0.82 to about 1:0.98, for example, about 1:0.89 to about 1:0.91. In some embodiments, a difference between the average thickness 360C and the average thickness 362C may be about 1.2 Å to about 2.2 Å, such as about 1.5 Å to about 1.9 Å. If the difference is too small, the benefit associated with the asymmetric design (e.g. mitigate the effect of etching on the integrity of the gate dielectric layer 228) may be lost or partially lost; if the difference is too large, the benefit of the extra thickness (e.g. on top of the semiconductor layers 220) may not justify their chip footprint.

The portion of gate dielectric layer 228 on the dielectric layer 223 over the top surface of the semiconductor substrate 201 has an average thickness 360S. In some embodiments, the average thickness 360S is less than the average thickness 360A. For example, a difference Δ(A–S) between the 360S and the average thickness 360A is about 0.5 Å to about 1.1 Å, such as about 0.7 Å to about 0.9 Å. In some embodiments, the average thickness 360B is less than the average thickness 360C. For example, a difference Δ(C–B) between the 360C and the average thickness 360B is about 1 Å to about 2.5 Å, such as about 1.6 Å to about 2.0 Å. In some embodiments, the thicknesses 362A is less than the average thickness 362B; and the average thickness 362B is less than the average thickness 362C. For example, a difference Δ'(C–B) between the 362C and the average thickness 362B and the difference Δ'(B–A) between the 362B and the average thickness 362A is about 0.1 Å to about 0.5 Å, such as about 0.1 Å to about 0.3 Å. If the difference is too small, the benefit associated with the asymmetric design (e.g. mitigate the effect of etching on the integrity of the gate dielectric layer 228) may be lost or partially lost; if the difference is too large, the benefit of the extra thickness (e.g. around higher semiconductor layers 220) may not justify their chip footprint.

As illustrated in the zoomed-in insert of FIG. 5, in some embodiments, portions of the gate dielectric layers 228 on sidewall surfaces of the semiconductor layers 220 similarly have non-uniform thicknesses. For example, within the same portion of the gate dielectric layer 228 on a sidewall surface of the semiconductor layer 220C (or any other semiconductor layers), a top section (i.e. the section further away from the substrate) may have a thickness greater than that of a bottom section (i.e. the section closer to the substrate). The asymmetric (or non-conformal) gate dielectric layers 228 may be formed by any suitable methods. In some embodiments, due to the very narrow spacing in gate trenches and more so between channel layers, the deposition of material layers (even in the case of ALD) no longer conforms to the common assumption of layer-by-layer growth. Accordingly, by carefully design the material flow, such as by controlling the flow rate, pulse time duration, etc. the lack of equilibrium may be leveraged to form the asymmetric profile described above. For example, by implementing methods described below in reference to FIGS. 6A-6D, dielectric materials are directed to accumulate and grow in areas where thicker layers are more desirable, and away from areas where thinner layers are preferred. FIGS. 6A-6D illustrate expanded cross sections views of a portion of one of the semiconductor layers 220 along with the dielectric layer 223 formed thereupon. Although FIGS. 6A-6D illustrate the layer 223 being vertically above the semiconductor layer 220, the processes described in FIGS. 6A-6D occur not only adjacent the top surface of the semiconductor layers 220, but also similarly adjacent the bottom surfaces and sidewall surfaces of the semiconductor layers 220. In other words, similar processes occur on the exposed top, bottom, and sidewall surfaces of the dielectric layers 223 wrapping around the semiconductor layers 220. However, in some embodiments, partly due to the parameters of the processes implemented, as described below, reactions on these different surfaces have different rates and/or efficiencies, which leads to the different thicknesses of the gate dielectric layers 228 in different areas.

As described above, the dielectric layer 223 includes an oxide material, such as silicon oxide. In some embodiments, the dielectric layer 223 may include hydroxy (—OH) functional groups on the exposed surfaces (which may be a top surface, a bottom surface, or sidewall surfaces of the dielectric layer 223). For example, the hydroxy groups may have their oxygen atoms attached to a silicon atom of the dielectric layer 223 and may have the hydrogen atoms pointing away from the respective silicon atom and therefore pointing away from the semiconductor layers 220. As described in detail below, these hydroxy groups may function as the anchoring points for subsequently formed gate dielectric layer 228, such that the adhesion between the gate dielectric layer 228 and the dielectric layer 223 is improved. Referring to block 1080 of FIG. 1 and to FIG. 6A, a precursor to the gate dielectric layers 228 ("precursor A") is introduced in the process 402 into the processing chamber. In some embodiments, the precursor A may include a metal atom and ligand atoms and may be denoted as $ML_n$. In some embodiments, the metal atom is a tetravalent metal and is chemically bonded with four ligands (L). For example, in some embodiments, the precursor A may be zirconium chloride ($ZrCl_4$), hafnium chloride ($HfCl_4$), tetrakis(ethylmethylamido)hafnium (TEMAHf), silicon chloride ($SiCl_4$), other zirconium halides, other hafnium halides, other silicon halides, other amino-hafnium complexes, other metal halides, other amine complexes of transition metals, or combinations thereof. In some embodiments, the processing environment is configured to allow for, or to induce, a reaction between the precursor A and the dielectric layer 223. For example, the metal atom of precursor A may interact with the hydroxy groups on the exposed surfaces of the dielectric layer 223. For example, the metal atom and the oxygen atom of the hydroxy group may interact with each other to form chemical bonds (such as a covalent chemical bond) between them. In other words, M-O chemical bonds are formed on the surfaces of the dielectric layers 223. Meanwhile, the ligand atom forms another chemical bond with the hydrogen atom of the hydroxy group, such as a H-L bond. Accordingly, the L ligands are detached from the surfaces of the dielectric layer 223. In some embodiments, the process 402 is configured to be a pulsed process with a pulse duration of $t_1$. In some embodiments, the pulse time is about 0.75 s to about 3 s. If the pulse time is too short, there may be insufficient precursor available to react with; if the pulse time is too long, the cost may outweigh any benefit achieved.

Figure 6A:
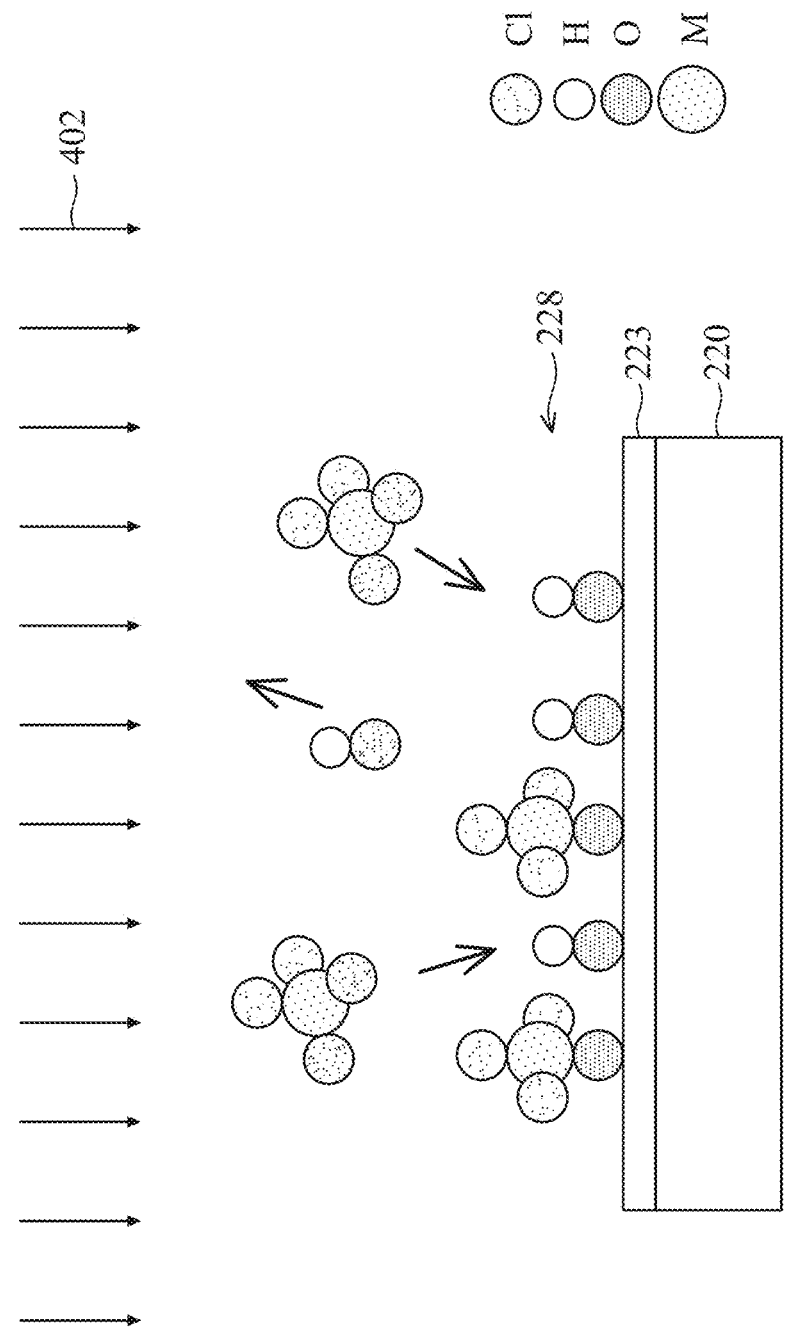
FIGS. 6A-6D are schematic views illustrating an example reaction implemented in an embodiment of the present disclosure.
Figure 6B:
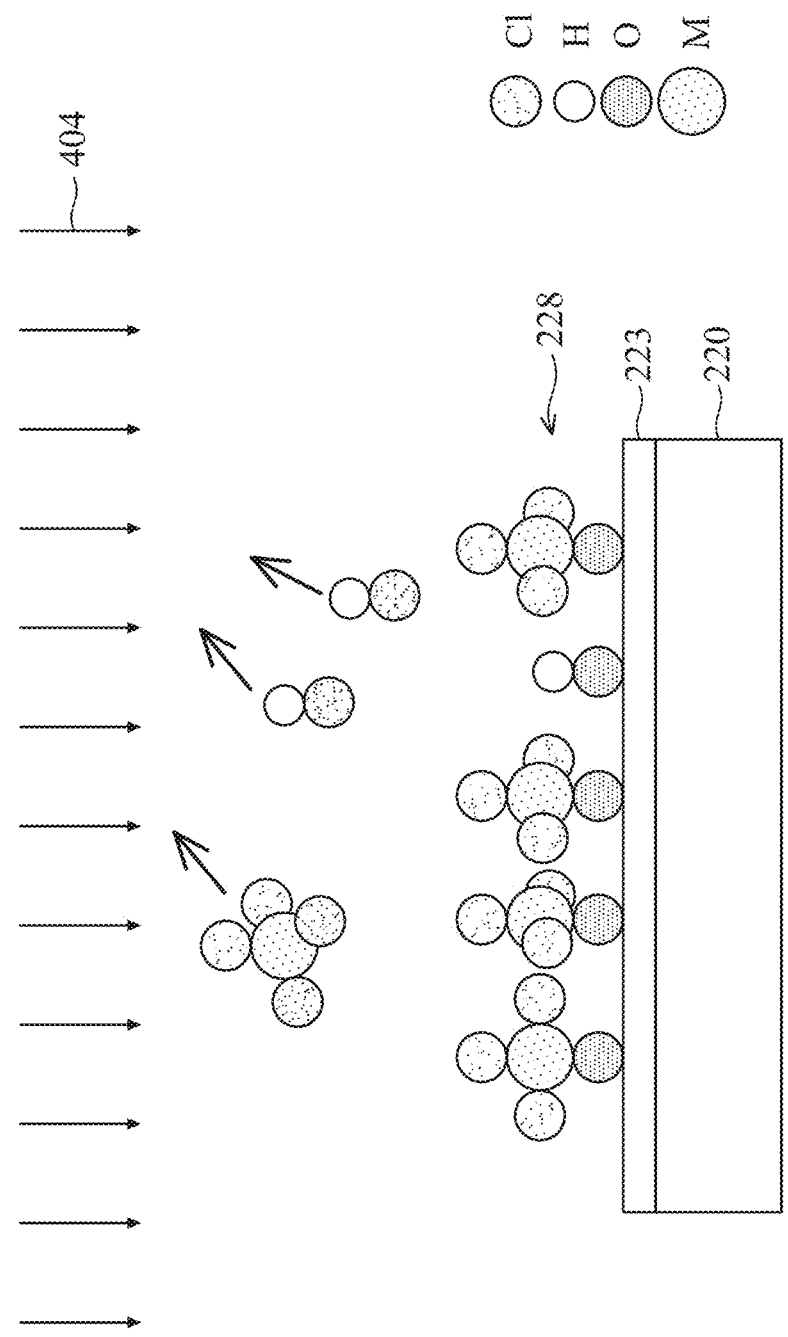

Referring to block 1082 of FIG. 1 and to FIG. 6B, process 404 purges excess amount of the precursor A along with byproduct H-L from the processing chamber. In some embodiments, the process 404 is configured to be a pulsed process with a pulse duration of $t_2$. In some embodiments, the pulse time is about 0.75 s to about 10 s. In some embodiments, a ratio of the pulse duration $t_2$ for the process 404 to the pulse duration $t_1$ for the process 402 is about 0.2:1 to about 1.6:1. Moreover, in some embodiments, a ratio of the pulse duration $t_2$ for the process 404 to the pulse duration $t_1$ for the process 402 is about 0.7:1 to about 1.1:1. If the pulse time $t_2$ is too long, such as greater than about 10 s, or if the ratio of the pulse duration $t_2$ to the pulse duration $t_1$ is too large, the precursor A may be desorbed from the surface such that insufficient precursor A remain for subsequent reactions. If the pulse time $t_2$ is too small, such as less than about 0.75 s, or if the ratio of the pulse duration $t_2$ to the pulse duration $t_1$ is too small, impurities may remain at the conclusion of the process. Accordingly, at the conclusion of the process 404, the dielectric layers 223 are modified to include metal atoms M. For example, the surfaces of the dielectric layers 223 may include metal atoms attached to the oxygen atoms of the dielectric layers 223, along with dangling ligands L pointing away from the surface of the dielectric layers 223. The metal atoms and the ligands L attached to the dielectric layers 223 become part of the gate dielectric layers 228. In some embodiments, majority (such as greater than about 80%) of the surface of the dielectric layer 223 is covered by the precursor A (or the M-L groups). In some embodiments, some hydroxy groups remain on the surfaces. Meanwhile, byproducts H-L are substantially removed during the process 404.

Figure 6C:
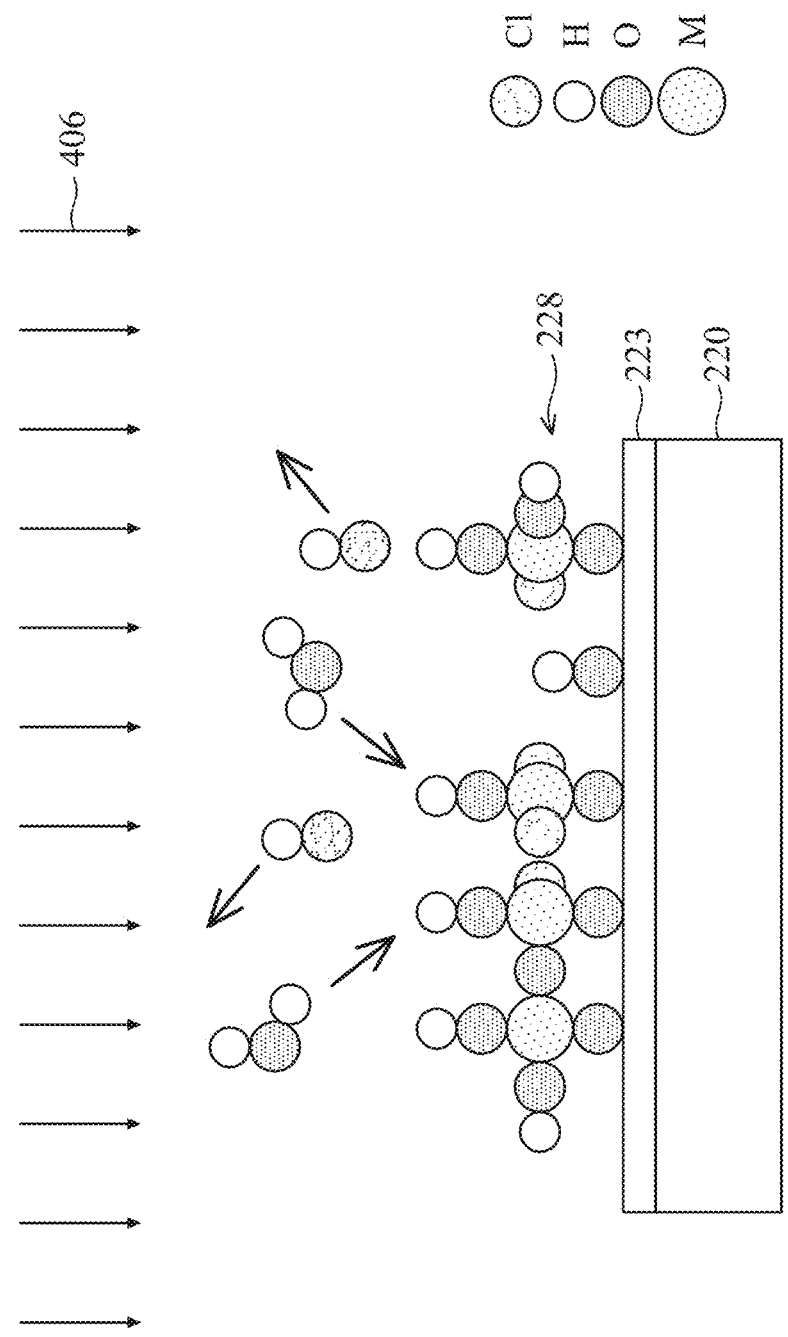

Referring to block 1084 of FIG. 1 and to FIG. 6C, another precursor to the gate dielectric layers 228 ("precursor B") is introduced in the process 406 into the processing chamber. In some embodiments, the processing environment is configured to allow for, or to induce a reaction, between the M-L functional groups on the surfaces of the dielectric layers 223 (or as part of the initial layer of the dielectric layer 228) and the precursor B. In some embodiments, the precursor B may include trimethylamine (TMA), water ($H_2O$), oxygen ($O_2$), ozone ($O_3$), other suitable precursors, or combinations thereof. In some embodiments, the reaction forms additional metal-oxygen (M-O) chemical bonds (e.g., in addition to the M-O chemical bonds formed between the metal atoms and the oxygen atoms of the dielectric layer 223). In some embodiments, the reaction forms metal-nitrogen (M-N) chemical bonds. In some embodiments, the interaction may be a metathesis reaction, where the precursor B replaces the ligand L to bond with the metal atom M. In some embodiments, the interaction may be a hydrolysis reaction or an aminolysis reaction. In some embodiments, the interaction may be an oxidation reaction. In some embodiments, the interaction may include one or more of the metathesis reaction, the hydrolysis reaction, the aminolysis reaction, the oxidation reaction. For example, In the depicted embodiments, the metal atom M was attached to multiple L ligands. Similarly, the process 406 causes the M atom to be attached to multiple O or N atoms. The formed product becomes a portion of the gate dielectric layer 228. Meanwhile, byproducts including the ligand L detach from the surfaces. In some embodiments, the M-O or M-N bonds are stronger than the M-L bonds, which provides the driving force for the reaction to proceed. In some embodiments, the reactions are equilibrium in nature. In such embodiments, the presence of accumulating byproducts, such as those incorporating the L ligands, may impede the completion of the reaction. Therefore, as the byproducts buildup, the reaction rate may decrease.

Figure 13:
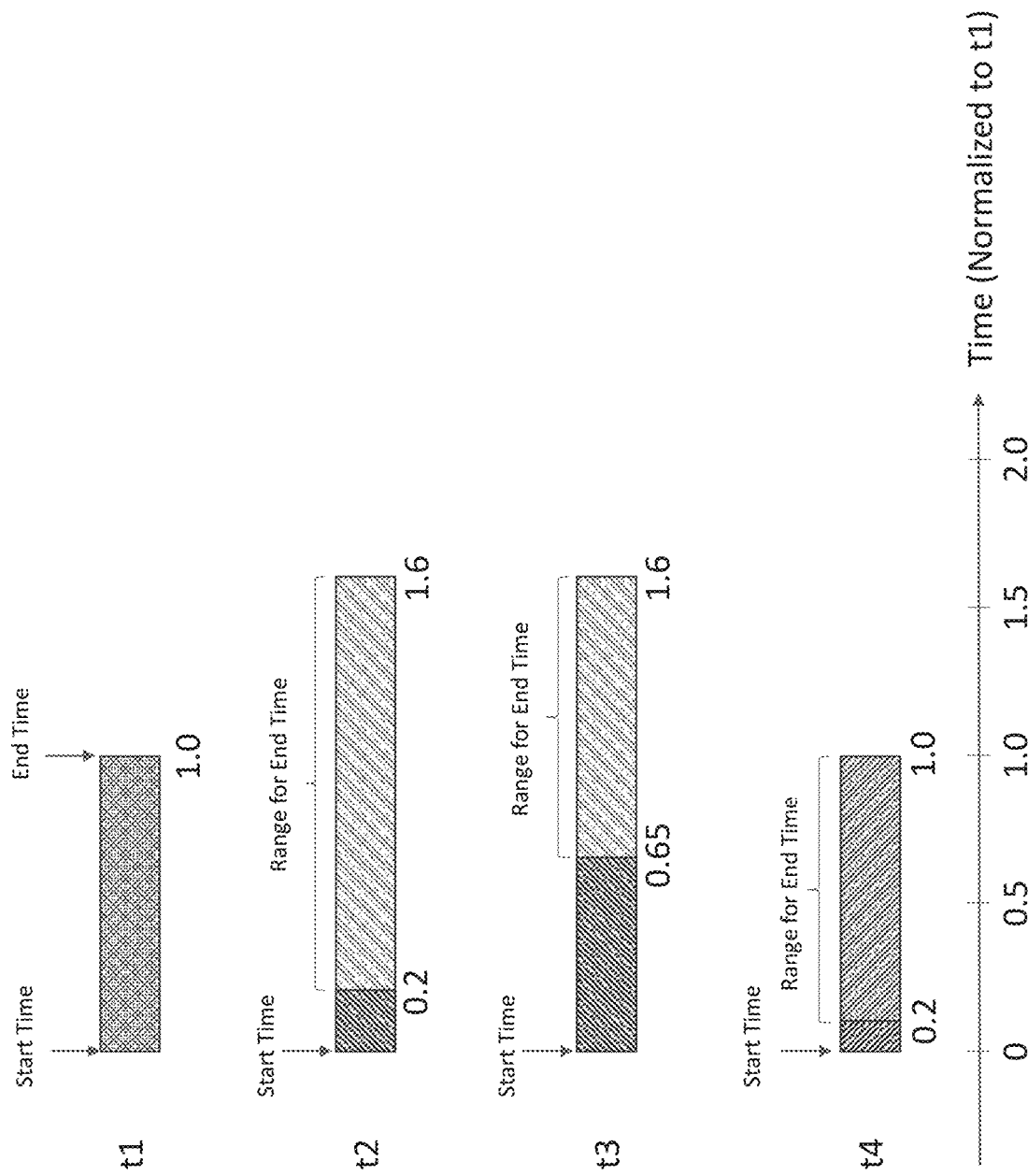
FIG. 13 illustrates certain parameters of the process according to some embodiments of the present disclosure.

During the process 406, additional M-O chemical bonds or M-N bonds are formed on the surfaces of the dielectric layers 228. In some embodiments, the process 406 is configured to be a pulsed process with a pulse duration of t3. In some embodiments, the pulse time $t_3$ is about 0.3 s to about 15 s. FIG. 13 illustrates some parameters implemented herein. As seen in FIG. 13, a ratio of the pulse time $t_3$ to the pulse time $t_1$ according to embodiments of the present disclosure may be about 0.65 to about 1.6. If the pulse time duration $t_3$ is too long, such as greater than about 15 s, or if the ratio of the pulse time $t_3$ to the pulse time $t_1$ is too large, such as greater than about 1.6, oxidation (or re-oxidation) to the substrate may occur and cause device performance degradations. If the pulse time duration $t_3$ is too short, such as less than about 0.3 s, or if the ratio of the pulse time $t_3$ to the pulse time $t_1$ is too small, such as less than about 0.65, impurities may remain following the reaction. In some other approaches not implementing embodiments of methods of the present disclosure, the ratio may be about 0.2 to about 0.6. In such approaches, the thicknesses of the gate dielectric layers 228 above and below the semiconductor layers 220 may be much more similar to one another. Accordingly, the benefits of the asymmetric configuration of the gate dielectric layer 228, with respect to the maintaining the integrities of the gate dielectric layer 228, may be lost. If the ratio is too large, such as greater than about 1.6:1, any benefit achieved may be offset by the greater processing cost. It has been observed by implementing the ratios described here, the portion of the gate dielectric layer 228 above the semiconductor layer 220C may have a thickness that is greater than the portions of the gate dielectric layer 228 above the lower semiconductor layers 220B or 220A by about 1 Å to about 4 Å, such as about 2 Å to about 3 Å.

Figure 6D:
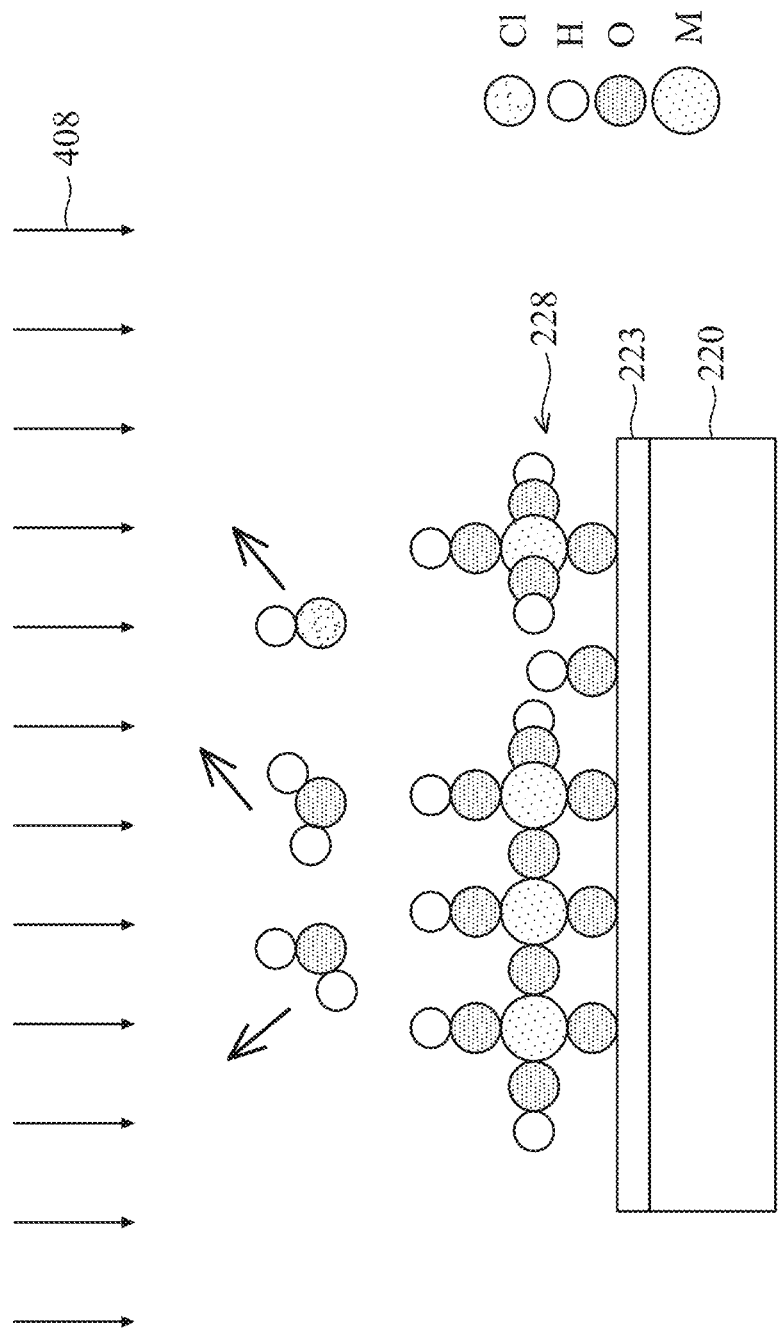

Referring to block 1086 of FIG. 1 and to FIG. 6D, the byproducts H-L and excess amount of the precursor B are purged away in process 408. As described above, excess amount of the byproduct impedes the completion of the reaction. Accordingly, removing the excess amount of the byproducts drives the reaction towards the completion. In some embodiments, the process 408 is configured to be a pulsed process with a pulse duration of $t_4$. In some embodiments, the pulse time $t_4$ is about 0.75 s to about 10 s. In some embodiments, referring to FIG. 13, a ratio of the pulse duration $t_4$ for the process 408 to the pulse duration $t_1$ for the process 402 is about 0.2:1 to about 1:1. In some embodiments, a ratio of the pulse duration $t_4$ for the process 408 to the pulse duration $t_1$ for the process 402 is about 0.5:1 to about 0.8:1. If the pulse time $t_4$ is too long, such as greater than about 10 s, or if the ratio of the pulse duration $t_4$ to the pulse duration $t_1$ is too large, the precursor A or B may be desorbed such that insufficient reactants are available to form the gate dielectric layer 228. If the pulse time $t_4$ is too short, such as greater than about 0.75 s, or if the ratio of the pulse duration $t_4$ to the pulse duration $t_1$ is too small, impurities may remain at the conclusion of the reaction. It has been observed by implementing the ratios described here, the portion of the gate dielectric layer 228 above the semiconductor layer 220C may have a thickness that is greater than the portions of the gate dielectric layer 228 above the lower semiconductor layers 220B or 220A by about 1 Å to about 5 Å, such as about 2 Å to about 4 Å. In some other approaches not implementing the methods of the present disclosure, the ratio may be greater than about 1:1, such as between about 1.05:1 to about 1.6:1. In such approaches, the gate dielectric layers 228 may have substantially similar thicknesses both above and below the semiconductor layers 220.

Accordingly, at the conclusion of the process 408, one layer of gate dielectric material that forms a portion of the gate dielectric layer 228 is formed. In some embodiments, the gate dielectric material, similar to the dielectric layer 223, also includes hydroxy groups. Accordingly, the gate dielectric material may serve the function of the dielectric layer 223 in a subsequent deposition and/or growth cycle. Referring to block 1088 of FIG. 1, depending on the desired thickness of the gate dielectric layer 228, the processes 402-408 described above with respect to the FIGS. 6A-6D may be repeated. For example, a second layer of the gate dielectric material may be formed over and wrapping the first layer. In such embodiments, following the conclusion of the process 408 of the first reaction cycle, the process 402 of the second cycle introduces the precursor A such that the precursor A diffuses into areas adjacent the gate dielectric layer 228, and interacts with the hydroxy groups thereon to form a second layer of the gate dielectric material. Subsequent processes 404-408 are substantially similar to those already described above. Each cycle will produce a layer (or sublayer) of gate dielectric material which has a greater thickness on top of the semiconductor layers 220 than on bottom of the semiconductor layers 220. When the desired thickness profile is reached, the formation of the gate dielectric layer 228 is completed, where the gate dielectric layer 228 has the desired asymmetric profile.

Figure 7:
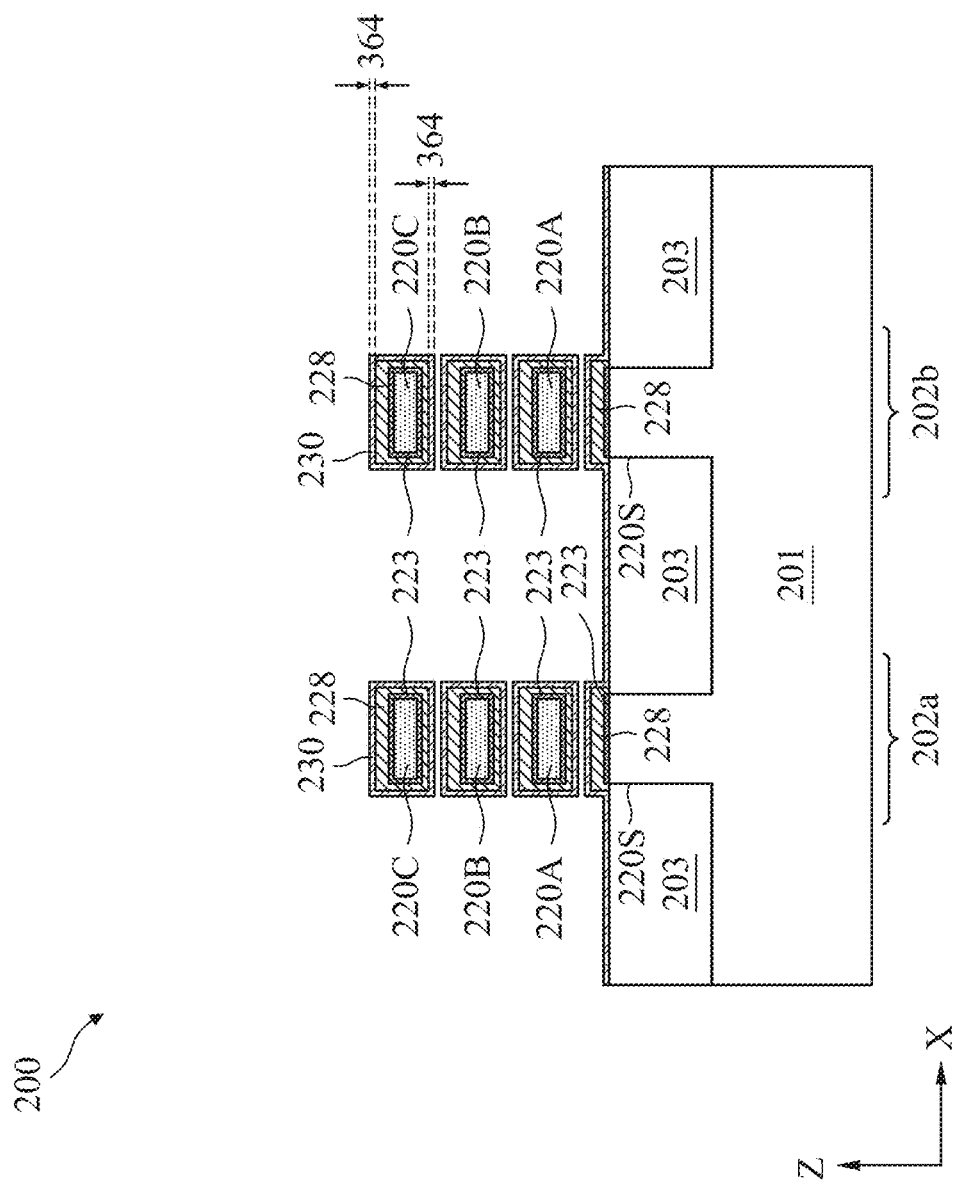

Referring to block 110 of FIG. 1 and to FIG. 7, capping layer 230 is formed over and wrapping the gate dielectric layers 228 around each of the semiconductor layers 220. In some embodiments, the capping layer 230 is configured to have a substantially uniform thickness. For example, a thickness of the capping layer 230 throughout its profile (such as on top surface, bottom surface, and on sidewall surfaces of the gate dielectric layers 228) is average thickness 364. In some embodiments, the average thickness 364 is about 1 nm to about 3 nm. Exemplary materials for the capping layer 230 include titanium nitride (TiN), tantalum nitride (TaN), tungsten nitride (WN), tungsten carbonitride (WCN), titanium silicon nitride (TiSiN), and/or tantalum silicon nitride (TaSiN). Any suitable depositions may be used, such as ALD, CVD, PVD, HDPCVD, MOCVD, RPCVD, PECVD, LPCVD, ALCVD, APCVD, spin coating, plating, other deposition process, or combinations thereof. The processing parameters may be tuned to achieve the capping layer 230 with a desired thickness.

Figure 8:
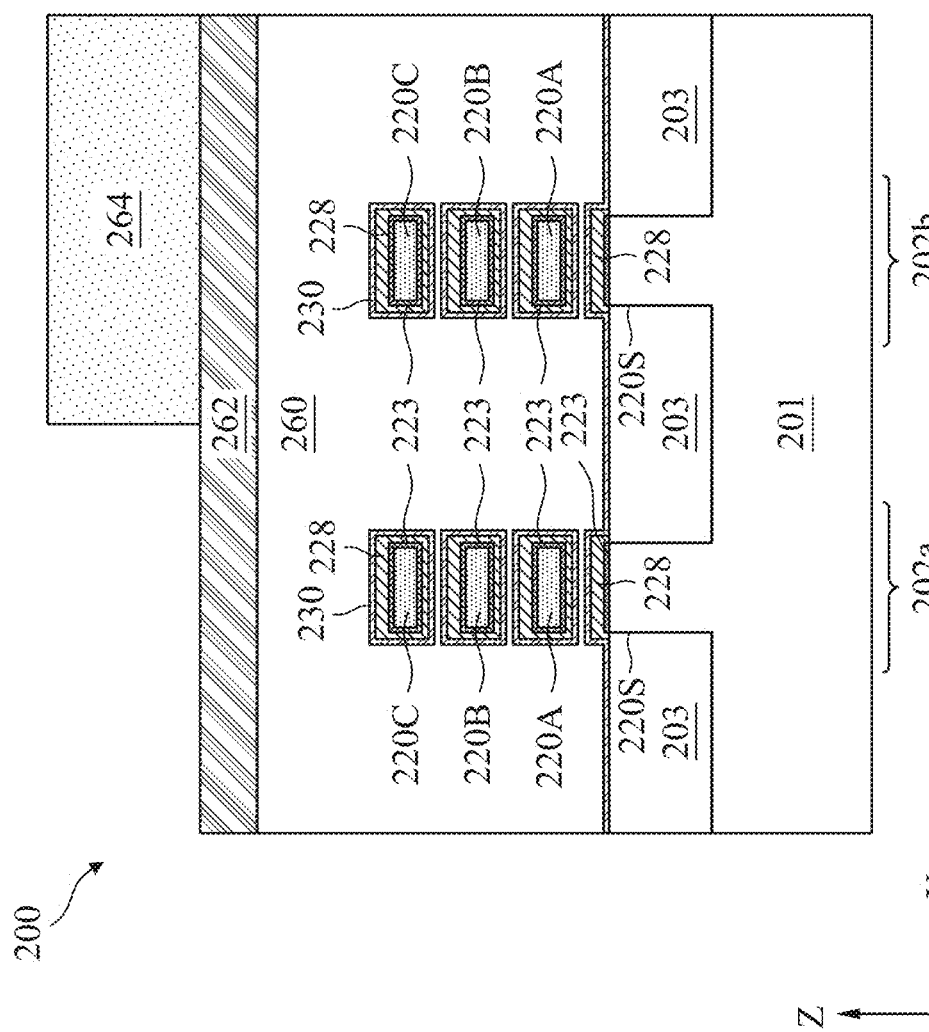

Referring to block 112 of FIG. 1, the processing continues to a multi-patterning process, in order to form transistors with different threshold voltages. Referring to FIG. 8, a protecting layer 260, such as a bottom anti-reflective coating (BARC) layer is formed over the substrate 201. For example, the protecting layer 260 may provide for absorption of radiation incident to the substrate during photolithography processes, including exposure of an overlying photoresist layer. The protecting layer 260 formed on the substrate may include one or more sublayers. In some embodiments, the protecting layer 260 may be about 60 nanometers (nm) to about 80 nm in thickness. The protecting layer 260 may be formed by one or more spin-on deposition processes that may be followed by one or more bake processes. In some embodiments, the protecting layer 260 is baked at an elevated temperature, for example, at a temperature of about 200° C. to about 230° C. In some embodiments, the baking operation removes solvent molecules within the BARC and causes densification therein.

A material layer 262, such as a low-temperature oxide layer is formed over the protecting layer 260. A patterned photoresist layer 264 is formed on the material layer 262. The photoresist layer 264 are patterned to define device regions in which the transistors have the same threshold voltages. For example, in the depicted embodiments, the patterned photoresist layer 264 is formed to cover the device region 202b while leaving the device region 202a. Accordingly, transistors in the device region 202a may have a first threshold voltage, and the device region 202b may have a second threshold voltage that is different from the first threshold voltage. This enables the fabrication of multi-V devices. The photoresist layer 264 may be positive-tone or negative-tone resist. In an embodiment, the photoresist is chemical amplified photoresist (CAR). The photoresist may include a polymer, a photoacid generator (PAG), which provides the solubility change to the developer, a solvent, and/or other suitable compositions. The photoresist may be formed by processes such as coating (e.g., spin-on coating) and soft baking.

Figure 9:
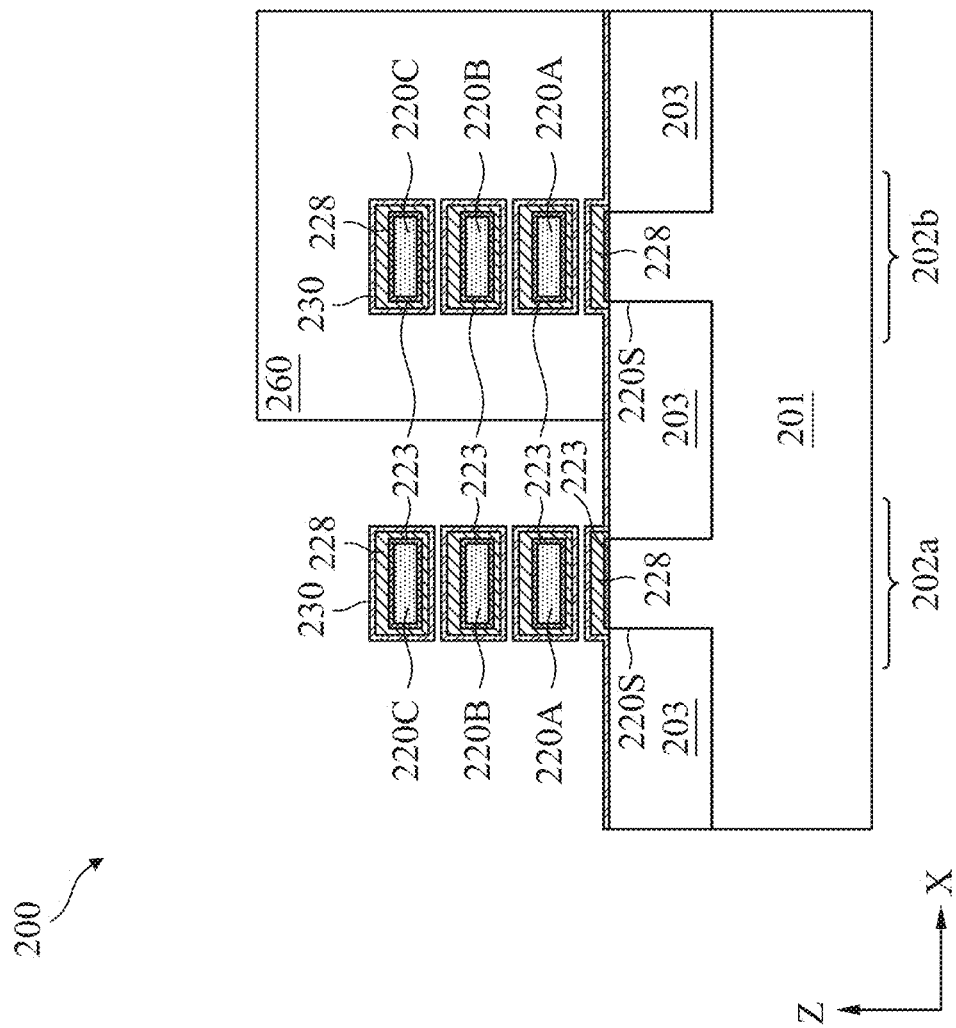

Still referring to block 112 of FIG. 1 and to FIG. 9, a dry etching operation removes the portion of material layer 262 and the protecting layer 260 in the region 202a not covered by the photoresist layer 264. The dry etching operation may implement any suitable dry etching methods. For example, the material layer 262 and the protecting layer 260 are etched with a reactive ion etch (RIE) process, using the patterned photoresist layer 264 as the etch mask. In some examples, the dry etch process may be implemented using an etchant gas that includes a fluorine-containing etchant gas (e.g., $NF_3$, $CF_4$, $SF_6$, $CH_2F_2$, $CHF_3$, and/or $C_2F_6$), an oxygen-containing gas (e.g., $O_2$), a chlorine-containing gas (e.g., $Cl_2$, $CHCl_3$, $CCl_4$, $SiCl_4$, and/or $BCl_3$), a nitrogen-containing gas (e.g., $N_2$), a bromine-containing gas (e.g., HBr and/or $CHBr_3$), an iodine-containing gas, other suitable gases and/or plasmas, or combinations thereof. In some embodiments, the dry etch process removes the protecting layer 260 from above, between, and on sidewall surfaces of the semiconductor layers 220 in the device regions 202a, thereby exposing the surfaces of the capping layers 230. Moreover, in some embodiments, the bombardment of the dry etching operation causes intermixing between the capping layer 230 and the gate dielectric layer 228. Meanwhile, the material layer 262 and the protecting layer 260 in the device regions 202b are substantially preserved. Following the dry etching process, the patterned photoresist 264 is removed.

Still referring to FIG. 9, following the removal of the patterned photoresist 264, the portion of the material layer 262 in the device region 202b is removed in a wet etching operation. In some embodiments, the wet etching operation may be an over-etching process. For, example, the wet etching operation may implement an over-etching process using tris-borate-ethylene diamine tetraacetic acid (TBE) as the etching reactant at a concentration of about 20% to about 30%. In some embodiments, the wet etching operation is configured to substantially remove all the material layer 262 without substantially affecting the protecting layer 260 in the device region 202b or the capping layer 230 in the device region 202a. At this processing stage, the capping layer 230 around the semiconductor layers 220 in the device region 202a are vertically spaced away from each other.

Figure 10:
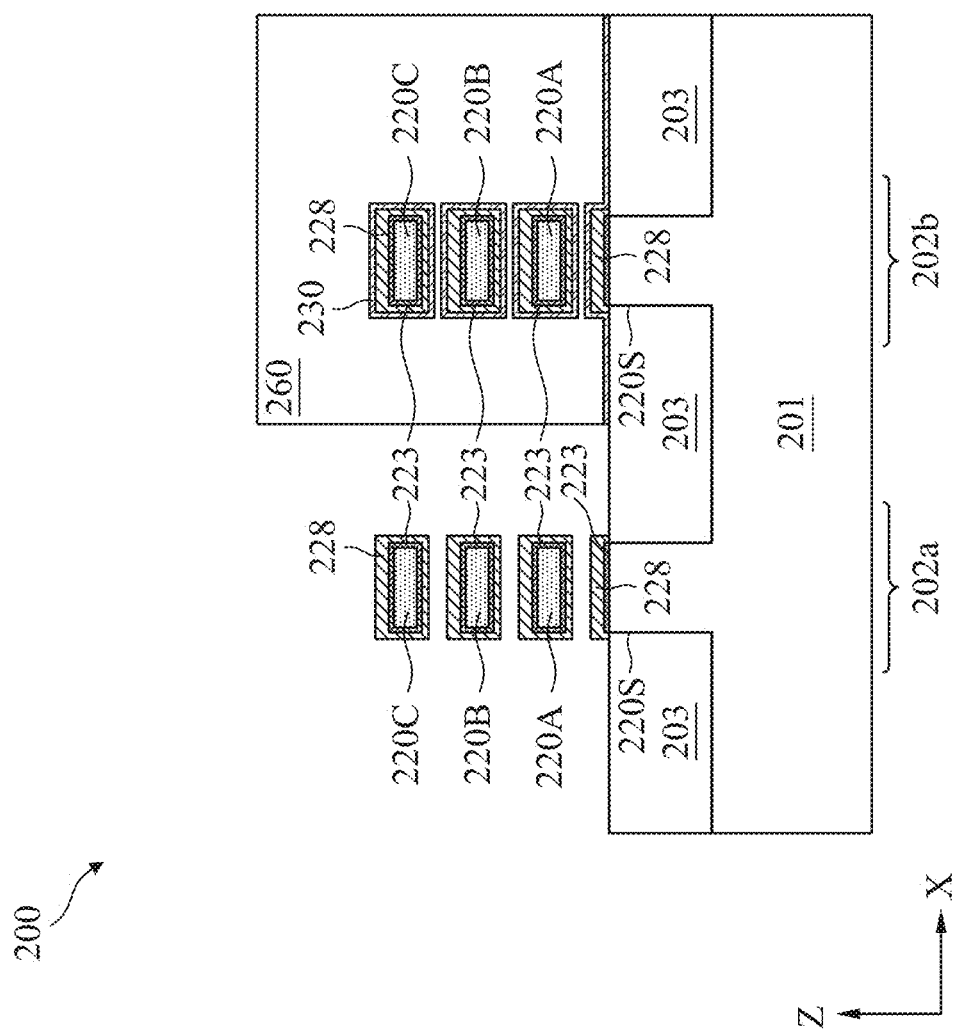

Still referring to block 112 of FIG. 1 and further to FIG. 10, the capping layer 230 is selectively removed in the device region 202a. In some embodiments, the capping layer 230 is removed in a wet etching operation. The wet etching operation is configured to remove only the capping layer 230 without significantly affecting the gate dielectric layer 228 in the device region. For example, parameters of the wet etching operation may be selected to achieve an etching rate of the capping layer 230 that is about 10 to 20 times higher than the etching rate of the gate dielectric layer 228 in the same operation. In some embodiments, the wet etching operation implements a hydrogen fluoride (HF) etching solution at a concentration of about 1% to about 10%. However, the etching selectivity may not be perfect, particularly because the intermixing between the capping layer 230 and the gate dielectric layer 228. Therefore, the gate dielectric layer 228 may still be etched, albeit to a significantly smaller extent than the capping layer 230. Given the very small initial thickness of the gate dielectric layer 228 in advanced technology nodes, such small amount of damage still asserts significant effects. In approaches not implementing methods of the present disclosure, such defects may cause degradations to the device performances, or even device failures.

The present disclosure recognizes that different portions of the gate dielectric layers 228 are subject to different amount of damage during the etching operations. For example, the etching reactant approaches the gate dielectric layers 228 from above the device 200. Moreover, the etching reactant diffuses from areas around sidewalls of the semiconductor layers 220 and above the isolation structure 203 into the spacing 157 between vertically adjacent semiconductor layers. Accordingly, the gate dielectric layer 228 wrapping around the top semiconductor layer 220 (such as the semiconductor layer 220C) are subject to more etching than the gate dielectric layer 228 over that wrapping around the lower semiconductor layers 220. And those wrapping around the lower semiconductor layers 220 may be subject to more etching than those covering the semiconductor substrate 220S. Furthermore, the gate dielectric layers 228 on the top surface of each of the semiconductor layers 220 are subject to more etching as compared to the portion of the gate dielectric layer 228 on the bottom surface of the same semiconductor layer 220. In other words, there exists an etching efficiency profile that changes depending on the location of the gate dielectric layer 228. By engineering the gate dielectric layer 228 to have thickness profile consistent with the etching profile, such as the thickness profile described above with respect to FIG. 5, the damages to the gate dielectric layers 228 may be effectively minimized. For example, despite more damages to the top portions of the gate dielectric layer 228 on the topmost semiconductor layers 220 (or semiconductor layer 220C), this particular portion of the gate dielectric layer 228 may be able to maintain substantial amount of its performance characteristics given the increased thickness in this particular region, the performance gains therefore can be received.

Figure 11:
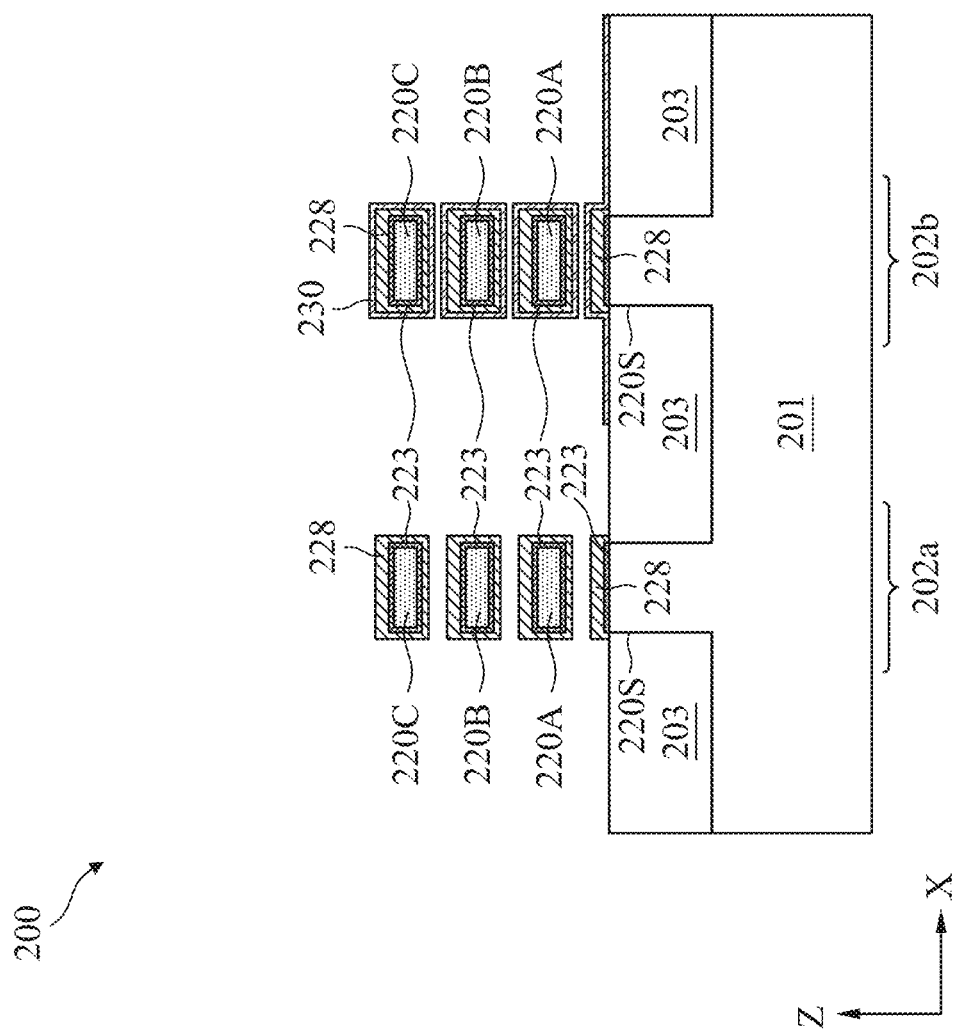

Referring to FIG. 11, the protecting layer 260 in the device region 202b is removed, such as by a suitable ashing process. In some embodiments, the ashing process may include an oxygen-containing plasma. Accordingly, the capping layer 230 becomes exposed in the device region 202b. At this processing stage, the gate dielectric layer 228 is exposed in the device region 202a and covered under the capping layer 230 in the device region 202b. Subsequently, work function metals may be formed selectively in the device region 202a, on and wrapping the gate dielectric layer 228.

Figure 12:
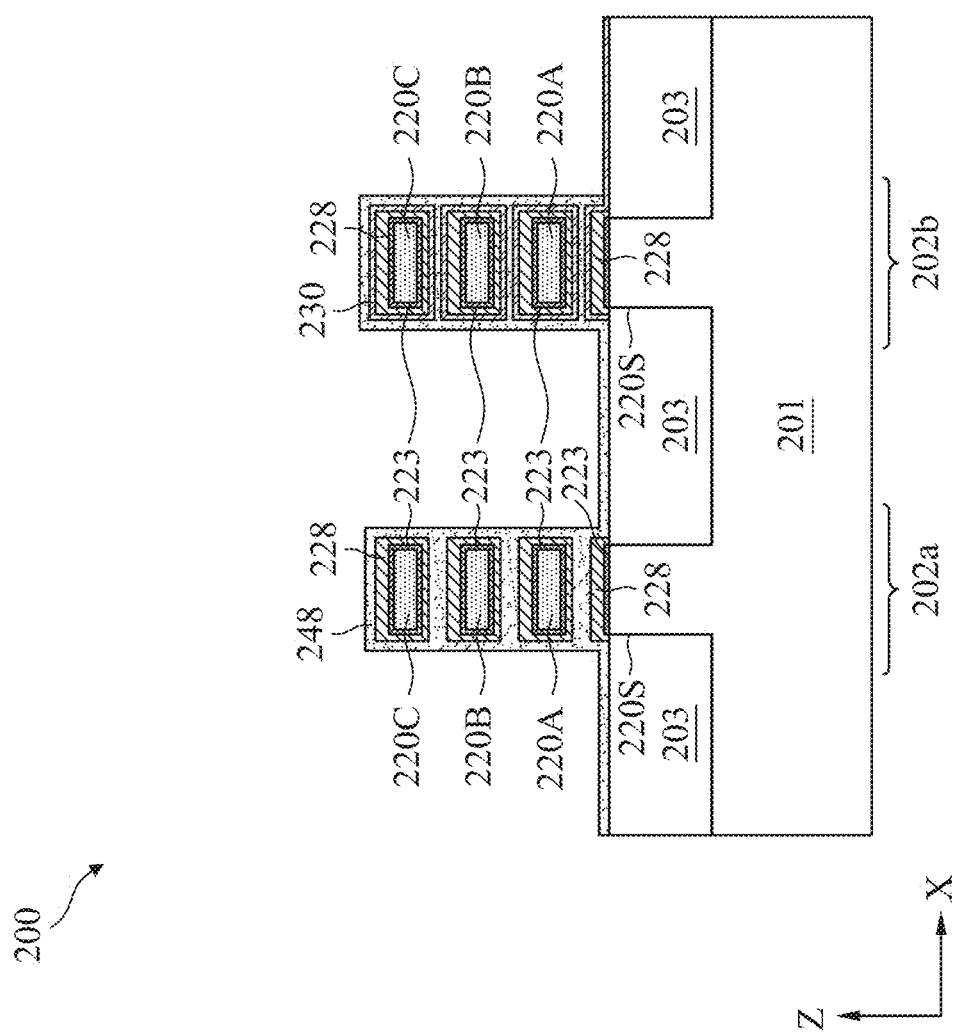

Referring to block 114 of FIG. 1 and to FIG. 12, WFM layers 248 are formed over the device 200. The WFM layer 248 may include any suitable materials, such as titanium nitride (TiN), tantalum nitride (TaN), titanium aluminide (TiAl), titanium aluminum nitride (TiAlN), tantalum aluminide (TaAl), tantalum aluminum nitride (TaAlN), tantalum aluminum carbide (TaAlC), tantalum carbonitride (TaCN), aluminum (Al), tungsten (W), copper (Cu), cobalt (Co), nickel (Ni), platinum (Pt), or combinations thereof. The WFM layer 248 may be formed using any suitable methods, such as ALD, CVD, PVD, other suitable methods, or combinations thereof. In the depicted embodiments, the WFM layer 248 is formed on and directly contacting the gate dielectric layer 228 in the device region 202a. As described earlier, the asymmetric profile of the gate dielectric layer 228 of this present disclosure ensures the gate dielectric layer 228 interfaces between the WFM layer 248 and the interfacial layer 223 throughout without defects. In some other approaches not implementing the methods described herein, the gate dielectric layer 228 may have been severely damaged during the dry and/or etching operations, such that the WFM layer 248 may directly contact the dielectric layer 223 or in some instances directly contact the semiconductor layers 220 in certain areas, leading to performance degradations or failures.

Still referring to FIG. 12, the WFM layer 248 is formed over the capping layer 230 in the device region 202b, such that the WFM layer 248 is spaced apart from the gate dielectric layer 228. In a subsequent operation, the WFM layer 248 and the capping layer 230 may be removed to expose the underlying gate dielectric layer 228, when another WFM layer is formed thereon to form a transistor having a different threshold voltage. In such additional processes, the asymmetric profile of the gate dielectric layer 228, in the device region 202b, also ensures its integrity, similar to that in the device region 202a.

Although the process above describes the formation of multi-Vt devices, in some embodiments, the same process may be implemented to form device having different types of transistors, such as n-type transistors adjacent to p-type transistors. In such embodiments, the device regions 202a and 202b may each be a device region with a different dopant type. The processes may be otherwise similar to those described above with respect to the FIGS. 1-12. Moreover, in some embodiments, the process described above with respect to FIGS. 8-12 are repeated to fabricate devices having more than two threshold voltages (for each of the n-type and/or p-type devices).

Referring to block 116 of FIG. 1, method 100 may proceed to form additional layers and features to complete the fabrication of the device 200. For example, after the WFM layers for all device regions are properly formed, bulk metal layers may be deposited to complete the formation of the gate electrode. The gate dielectric layers 228 and the gate electrode collectively form the gate structure, such as high-k gate structures. Additional features may be formed for the device 200, some of the described features may be eliminated or replaced in some embodiments without departing from the spirit of the disclosure. Similarly, steps may be added before, between, or after steps of those described above; and some of the steps may be modified or eliminated without departing from the spirit of the disclosure.

In an exemplary aspect, the present disclosure is directed to a semiconductor device. The semiconductor device includes a stack of semiconductor layers vertically arranged above a semiconductor base structure, a gate dielectric layer having portions each surrounding one of the semiconductor layers, and a gate electrode surrounding the gate dielectric layer. Each portion of the gate dielectric layer has a top section above the respective semiconductor layer and a bottom section below the semiconductor layer. The top section has a top thickness along a vertical direction perpendicular to a top surface of the semiconductor base structure; and the bottom section has a bottom thickness along the vertical direction. The top thickness is greater than the bottom thickness.

In some embodiments, the semiconductor device further includes an interfacial layer interposing between each portion of the gate dielectric layer and the respective semiconductor layer. The interfacial layer is a conformal layer. In some embodiments, an intermediate layer interposes between the capping layer and the gate dielectric layer. The intermediate layer includes elements of the gate dielectric layer and elements of the capping layer. In some embodiments, a difference between the top thickness and the bottom thickness is about 0.1 to about 0.8. In some embodiments, a ratio of the top thickness to the bottom thickness is about 1:0.80 to about 1:0.99. In some embodiments, the portions of the gate dielectric layer include a first portion surrounding a bottommost layer of the semiconductor layers and a second portion surrounding a topmost layer of the semiconductor layers. The top thickness of the first portion is less than the top thickness of the second portion. In some embodiments, a difference between the top thickness of the first portion and the top thickness of the second portion is about 0.2 to about 0.8.

In an exemplary aspect, the present disclosure is directed to a method. The method includes receiving a structure of a semiconductor device in a processing chamber. The semiconductor structure includes a semiconductor substrate, a stack of first semiconductor layers and second semiconductor layers over the semiconductor substrate, a dummy gate structure over the stack, and source/drain features on both ends of the stack. The first semiconductor layers and the second semiconductor layers have different material compositions and alternate with one another within the stack. The dummy gate structure wraps around top and side surfaces of the stack. The method also includes removing the dummy gate structure and the first semiconductor layers, forming an interfacial layer surrounding the second semiconductor layers, forming a gate dielectric layer surrounding the interfacial layer, and forming a gate electrode surrounding the gate dielectric layer. The forming of the gate dielectric layer includes adjusting time durations to form the gate dielectric layer having a non-conformal profile.

In some embodiments, the forming of the gate dielectric layer includes introducing a first precursor to the gate dielectric into the reaction chamber for a first time duration, conducting a first purging process of the processing chamber for a second time duration, introducing a second precursor to the gate dielectric layer into the reaction chamber for a third time duration, and conducting a second purging process of the processing chamber for a fourth time duration. A ratio of the fourth time duration to the first time duration is about 0.2:1 to about 1:1. In some embodiments, a ratio of the third time duration to the first time duration is about 0.65 to about 1.6. In some embodiments, a ratio of the second time duration to the first time duration is about 0.2:1 to about 1.6:1. In some embodiments, the forming of the gate dielectric layer includes repeating the introducing of the first precursor, the conducting of the first purging process, the introducing of the second precursor, and the conducting of the second purging process. In some embodiments, the forming of the gate dielectric layer includes forming the gate dielectric layer with the top section having a first thickness and the bottom section having a second thickness. A difference between the first thickness and the second thickness is at least about 1 Å. In some embodiments, the method further includes forming a capping layer on the gate dielectric layer, and patterning the capping layer. In some embodiments, the patterning of the capping layer includes conducting a dry etching and a wet etching.

In an exemplary aspect, the present disclosure is directed to a method. The method includes receiving in a processing chamber a semiconductor structure. The semiconductor structure has a stack of first semiconductor layers and second semiconductor layers alternating with each other and vertically arranged above a semiconductor substrate and laterally between a pair of source/drain features. The method also includes removing the first semiconductor layers to expose surfaces of the second semiconductor layers, forming an interfacial layer around the exposed surfaces of the second semiconductor layers, introducing into the processing chamber a first precursor in a first time duration to interact with the interfacial layer, after the introducing of the first precursor, conducting a first purging of the processing chamber, introducing into the processing chamber a second precursor in a second time duration to form a first layer of a gate dielectric, after the introduction of the second precursor, conducting a second purging of the processing chamber, and forming a work function metal layer on the gate dielectric. The first time duration is less than the second time duration.

In some embodiments, a ratio of the first time duration to the second time duration is about 1:0.65 to about 1:1.6. In some embodiments, the conducting of the second purging includes purging for a fourth time duration, and where a ratio of the first time duration to the fourth time duration is about 1:0.2 to about 1:1. In some embodiments, the method further includes repeating the introducing of the first precursor, the conducting of the first purging, the introducing of the second precursor, and the conducting of the second purging until a desired thickness of the gate dielectric is reached.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a fin structure including a plurality of semiconductor channel layers; and
   respective gate dielectric layers surrounding each of the plurality of semiconductor channel layers;
   wherein each of the respective gate dielectric layers has an asymmetric thickness profile around each of the plurality of semiconductor channel layers.

2. The semiconductor device of claim 1, wherein the asymmetric thickness profile includes a non-uniform thickness of the respective gate dielectric layers along sidewall surfaces of each of the plurality of semiconductor channel layers.

3. The semiconductor device of claim 2, wherein the non-uniform thickness of the respective gate dielectric layers has a first thickness at a top portion of the sidewall surfaces and a second thickness less than the first thickness at a bottom portion of the sidewall surfaces.

4. The semiconductor device of claim 1, wherein a first semiconductor channel layer of the plurality of semiconductor channel layers is disposed over a second semiconductor channel layer of the plurality of semiconductor channel layers, and wherein a first top portion of a first respective gate dielectric layer disposed above the first semiconductor channel layer is thicker than a second top portion of a second respective gate dielectric layer disposed above the second semiconductor channel layer.

5. The semiconductor device of claim 4, wherein a first bottom portion of the first respective gate dielectric layer disposed beneath the first semiconductor channel layer is thicker than a second bottom portion of the second respective gate dielectric layer disposed beneath the second semiconductor channel layer.

6. The semiconductor device of claim 1, further comprising an interfacial layer disposed between the respective gate dielectric layers and each of the plurality of semiconductor channel layers, wherein the interfacial layer has a substantially uniform thickness profile around each of the plurality of semiconductor channel layers.

7. The semiconductor device of claim 1, further comprising a capping layer surrounding each of the respective gate dielectric layers, wherein the capping layer has a substantially uniform thickness profile around each of the respective gate dielectric layers.

8. A semiconductor device, comprising:
a first semiconductor layer;
a second semiconductor layer over the first semiconductor layer;
first and second gate dielectric layers surrounding the first and second semiconductor layers, respectively; and
a common gate electrode surrounding the first and second gate dielectric layers, wherein each of the first and second gate dielectric layers has first asymmetric thicknesses below and above the respective first and second semiconductor layers.

9. The semiconductor device of claim 8, wherein each of the first and second gate dielectric layers have second asymmetric thicknesses along sidewall surfaces of each of the respective first and second semiconductor layers.

10. The semiconductor device of claim 8, further comprising first and second interfacial layers interposing the first and second gate dielectric layers and the first and second semiconductor layers, respectively.

11. The semiconductor device of claim 10, wherein the first and second interfacial layers have a substantially uniform thickness profile.

12. The semiconductor device of claim 8, wherein the first gate dielectric layer is thicker above the first semiconductor layer than below the first semiconductor layer.

13. The semiconductor device of claim 12, wherein the second gate dielectric layer is thicker above the second semiconductor layer than below the second semiconductor layer.

14. The semiconductor device of claim 8, wherein the first gate dielectric layer has a first average thickness above the first semiconductor layer, wherein the second gate dielectric layer has a second average thickness above the second semiconductor layer, and wherein the first average thickness is less than the second average thickness.

15. The semiconductor device of claim 8, wherein the first gate dielectric layer has a first average thickness below the first semiconductor layer, wherein the second gate dielectric layer has a second average thickness below the second semiconductor layer, and wherein the first average thickness is less than the second average thickness.

16. A method, comprising:
forming a gate dielectric layer having an asymmetric thickness profile surrounding each of a plurality of semiconductor layers of a fin structure extending from a substrate; and
forming a gate electrode over the fin structure and surrounding each of the plurality of semiconductor layers,
wherein the forming of the gate dielectric layer having the asymmetric thickness profile comprises:
introducing a first precursor over the substrate for a first time duration,
performing a first purging process for a second time duration,
introducing a second precursor over the substrate for a third time duration, and
performing a second purging process for a fourth time duration.

17. The method of claim 16, wherein the gate dielectric layer is formed such that the asymmetric thickness profile includes a non-uniform thickness of the gate dielectric layer along sidewall surfaces of each of the plurality of semiconductor layers.

18. The method of claim 16, wherein a ratio of the second time duration to the first time duration is about 0.2 to about 1.6.

19. The method of claim 16, wherein a ratio of the third time duration to the first time duration is about 0.65 to about 1.6.

20. The method of claim 16, wherein a ratio of the fourth time duration to the first time duration is about 0.2 to about 1.0.

* * * * *